(12) United States Patent
Bungo et al.

(10) Patent No.: US 7,075,390 B1
(45) Date of Patent: Jul. 11, 2006

(54) SURFACE ACOUSTIC WAVE DEVICE

(75) Inventors: Akihiro Bungo, Saitama (JP); Ryohei Kimura, Saitama (JP); Koji Hasegawa, Hokkaido (JP); Masanori Koshiba, Hokkaido (JP)

(73) Assignee: Mitsubishi Materials Corporation, Tokyo (JP)

( * ) Notice: Subject to any disclaimer, the term of this patent is extended or adjusted under 35 U.S.C. 154(b) by 376 days.

(21) Appl. No.: 10/110,222

(22) PCT Filed: Oct. 31, 2000

(86) PCT No.: PCT/JP00/07616

§ 371 (c)(1),
(2), (4) Date: Aug. 2, 2002

(87) PCT Pub. No.: WO01/35528

PCT Pub. Date: May 17, 2001

(30) Foreign Application Priority Data

Nov. 11, 1999 (JP) .......................... 11/321806
Jun. 2, 2000 (JP) ...................... 2000-166702

(51) Int. Cl.
*H03H 9/00* (2006.01)
*H02N 2/00* (2006.01)
*G01L 41/04* (2006.01)
*G01L 41/08* (2006.01)
*G01L 41/18* (2006.01)

(52) U.S. Cl. ................................... 333/193; 310/313 A
(58) Field of Classification Search ................. 333/193, 333/195, 313 R, 313 A, 313 B; 29/25.35
See application file for complete search history.

(56) References Cited

U.S. PATENT DOCUMENTS 6,137,207 A * 10/2000 Inoue et al. ............ 310/313 A (Continued)

FOREIGN PATENT DOCUMENTS

EP 1229645 * 5/2001
JP 11-234080 8/1999

OTHER PUBLICATIONS

Koji Hasegawa et al.; Kiban no ihosei wo mochila 1 houkousei dansei hyoumenha sudare jou denkyoku no mode ketsugou riron ni motozuku 1 kaiseki hou Transactions of the Electronics, Information and Communication Engineers, vol. J77–C–1, No. 6, pp. 398–404 May 25, 1994.

(Continued)

*Primary Examiner*—Patrick Wambley
(74) *Attorney, Agent, or Firm*—Oblon, Spivak, McClelland, Maier & Neustadt, P.C.

(57) ABSTRACT

The surface acoustic wave device has the surface acoustic wave transducer, which consists of the positive electrode finger 102, the negative electrode finger 204, and the floating electrode 300, which are formed on the surface of the langasite single crystal substrate, where the substrate orientation and the surface acoustic wave propagation direction are chosen so that it may have the natural unidirectional property. When the wavelength of the surface acoustic wave is λ, each above-mentioned electrode is formed along the surface acoustic wave propagation direction, so that the width of above-mentioned positive electrode finger and the negative electrode finger may be about λ/8, the distance g between each center of the positive electrode finger and the floating electrode may be $13/40\lambda \leq g \leq 14/40\lambda$, and the width W of the floating electrode may be $11/40\lambda \leq W \leq 13/40\lambda$.

3 Claims, 19 Drawing Sheets

U.S. PATENT DOCUMENTS

| | | | | |
|---|---|---|---|---|
| 6,140,738 | A | * 10/2000 | Inoue et al. | 310/313 A |
| 6,163,099 | A | * 12/2000 | Kadota et al. | 310/313 A |
| 6,194,809 | B1 | * 2/2001 | Takeuchi et al. | 310/313 R |
| 6,285,112 | B1 | * 9/2001 | Takeuchi et al. | 310/313 A |

OTHER PUBLICATIONS

Koji Hasegawa et al.; "Coefficients of coupled–mode equations for a natural–single phase undirectional transducer and an electrode–width–difference–reversal–of–directivity transducer on a 50oY–24oX La3Ga5SiO14 substrate"Japanese Journal of Applied Physics, vol. 39, No. 5B, pp. 3020–3023, May 30, 2000.

Koji Hasegawa et al.: "Kiban no thousei wo mochilla 1 houkou sei dansel hyoumenha sudare jou denkyoku no mode ketsugou houteishiki no shoteisu no hybrid yugen youso hoyu nl yoru ketel hou" Transactions of the Instisute of Electronics, Information and Communicaitons Engineers, vol. J82–C–1, No. 13, pp. 735–743, Dec. 25, 1999.

V. B. Chvets. et al., "Design of Sawfilters on Langasite," 1999 IEEE Ultrasonics Symposium, pp. 295–299.

* cited by examiner

SURFACE ACOUSTIC WAVE DEVICE

TECHNICAL FIELD

This invention relates to a surface acoustic wave device used for a mobile-communications instrument etc.

BACKGROUND OF THE INVENTION

Although mobile communications instruments, such as a cellular phone and a portable terminal, have been spread rapidly in recent years, a filter used for these terminals is required for characteristics, that is low energy loss, a wide frequency band, and a small size, etc. A transmitting type surface acoustic wave (SAW) filter is in practical use, in which said filter has a single-phase unidirectional transducer as a device which fulfills these characteristics. In a single-phase unidirectional filter, a phase difference between an excitation wave and a reflective wave becomes the same phase to enhance each other in a front direction (at a forward direction), and is negated each other in an opposite direction (at a reverse direction). Therefore, the surface acoustic wave is strongly driven only at the forward direction. By this way, it is theoretically possible to realize a low loss filter less than 1 dB by opposing the direction of the unidirectional property of a transmitting electrode and a receiving electrode.

As the technology of realizing the unidirectional transducer, EWC-SPUDT and DART-SPUDT, using the asymmetrical electrode structure, are designed. Besides these filters using the asymmetry of the electrode structure, there is a natural unidirectional filter (NSPUDT: Natural Single Phase Unidirectional Transducer). The natural unidirectional filter realizes unidirectional property by using the asymmetry of a substrate crystal. Therefore, unidirectional property is realizable with the transducer having the structure called regular type inter digital transducer (IDT) structure, in which the multiple positive/negative electrode fingers, where both the electrode width and the electrode spacing are $\lambda/4$, have been arranged continuously and periodically.

Even if regular type IDT is formed on a ST-X quart crystal substrate, the surface acoustic wave generated by the excitation driving of said IDT is spread on a ST-X quart crystal substrate for the two way of said IDT, and cannot realize unidirectional property. That is to say, the natural unidirectional property shows the characteristic of the substrate, in which the surface acoustic wave is excited strongly to the uni-direction, when the regular type IDT is formed on a piezoelectric crystal substrate surface. In the surface acoustic wave transducer using this natural unidirectional substrate, since an anisotropy of the substrate itself is used, the forward directions of the transmitting-side transducer and the receiving-side transducer, cannot be opposed. If the unidirectional property cannot be opposed between the transmitting electrode and the receiving electrode, it is impossible to produce the low loss filter.

As the means to solve this problem, in Tokukai Hei 8-125484, the surface acoustic wave transducer is proposed as the electrode structure to reverse the direction of natural unidirectional property by Mr. Takeuchi etc., in which said surface acoustic wave transducer consisted of the positive and negative electrode fingers, which had the width of almost $\lambda/8$ and were arranged with the pitch of $\lambda$, and the floating electrodes, which had the width of $3/8\lambda$ and were arranged with the edge interval of almost $\lambda/8$ between said positive electrode fingers and negative electrode fingers.

The low loss filter which opposed the unidirectional property, is proposed by Mr. Takeuchi etc. in Tokukai Hei 8-204492, in which said filter used the electrode structure of reversing the direction of natural unidirectional property. In the electrode structure of reversing the direction of natural unidirectional property proposed by Mr. Takeuchi etc., when the wavelength of the surface acoustic wave is $\lambda$, the positive electrode finger and the negative electrode finger are arranged with the pitch of $\lambda$, respectively, the distance between each center of the positive electrode and the negative electrode is $\lambda/2$, the floating electrode having the width of $\lambda/4$ is formed between the positive electrode finger and the negative electrode finger, and the distance between each edge of the positive electrode finger or the negative electrode finger and the floating electrode, is formed so that it may be $\lambda/16$. Moreover, at least, the floating electrode of adjoining one pair is short-circuited (FIG. 5 in the above-mentioned patent), and it is also included when all floating electrodes are short-circuited (FIG. 6 in the above-mentioned patent).

The characteristic of the surface acoustic wave device depends on the characteristic of the piezoelectric crystal used as the substrate. It is important that an electromechanical coupling coefficient is large, and an frequency temperature characteristic is good, as the characteristic of this piezoelectric crystal. Now, langasite is attracted as the crystal which satisfies simultaneously these two characteristics. When langasite is described in $(\varphi,\theta,\psi)$ by Euler-angles viewing, the langasite being in the range of $-5° \leq \varphi \leq 5°$, $135° \leq \theta \leq 145°$, and $20° \leq \psi \leq 30°$, has the electromechanical coupling coefficients being 0.3% –0.4%, and the frequency temperature characteristic showing the secondary dependency, and the summit temperature existing near a room temperature. An electromechanical coupling coefficient is about 3 times of ST quart crystal. Moreover, the secondary temperature coefficient in the frequency temperature characteristics is about 2 times of quart crystal, and this value is very good. Therefore, langasite is expected to be applied to the low loss surface acoustic wave filter.

Langasite single crystal which is in the above-mentioned ranges by Euler-angle viewing, has NSPUDT characteristic, and for realizing the low-loss filter using this substrate, it is necessary that the electrode structure where the direction of unidirectional property counters in the transmitting electrode and receiving electrode, is constituted. Therefore, when regular type IDT is used for the transmitting electrode, wherein the multiple positive/negative electrode fingers, where both the electrode width and the electrode spacing are $\lambda/4$, have been arranged periodically and continuously, the structure, in which unidirectional property is inverted, has to be used in the receiving electrode. However, in the electrode structure proposed by Mr. Takeuchi etc., the optimum unidirectional inversion cannot be realized on the langasite substrate, and the request for realizing of the low loss filter cannot be answered.

This invention was made in view mentioned above, and aims to offer the surface acoustic wave device, which is enable to comprise the much low loss transmitting type surface acoustic wave (SAW) filter.

DISCLOSURE OF INVENTION

The invention described in the first aspect is the surface acoustic wave device having the surface acoustic wave transducer consisting of the positive electrode finger, the negative electrode finger, and the floating electrode arranged between these fingers, which are formed on the langasite single crystal substrate in which the substrate orientation and surface acoustic wave propagation direction are selected to have the natural unidirectional property. Moreover, in the above-mentioned surface acoustic wave transducer, each above-mentioned electrode is formed along the surface acoustic wave propagation direction in order to reverse the national unidirectional property.

The invention described in the second aspect is characterized with the surface acoustic wave device according to the first aspect, in which above-mentioned langasite single crystal substrate is in the range $-5° \leq \phi \leq 50°$, $13° \leq \theta \leq 14°$, and $20° \leq \psi \leq 30°$, or is the equivalent orientation in the crystallography, when the substrate orientation and the surface acoustic wave propagation direction are described in ($\phi$, $\theta$, $\psi$) by Euler angle viewing.

The invention described in the third aspect is characterized with the surface acoustic wave device according to the second aspect, in which, in the distance relationships between the above-mentioned positive electrode finger, the negative electrode finger, and the floating electrode, in the above-mentioned surface acoustic wave transducer, the widths of the above-mentioned positive electrode finger and the negative electrode finger, are about $\lambda/8$, the distance between each center of the positive electrode finger and the negative electrode finger, is about $6/8\lambda$, the distance g between each center of the positive-electrode finger and the floating electrode, is $13/40\lambda \leq g \leq 14/40\lambda$, and width W of the floating electrode is $11/40\lambda \leq W \leq 13/40\lambda$, when the wavelength of the surface acoustic wave is $\lambda$.

The invention described in the fourth aspect is characterized with the surface acoustic wave device having the surface acoustic wave transducer consisting of the positive electrode finger, the negative electrode finger, and the floating electrode arranged the between these fingers, which are formed on the langasite single crystal substrate in which the substrate orientation and surface acoustic wave propagation direction are selected to have the natural unidirectional property, and said floating finger is formed so that said floating electrode finger of an adjoining pair may short-circuit ranging over the above-mentioned negative electrode finger. Moreover, in the above-mentioned surface acoustic wave transducer, each above-mentioned electrode is formed along the surface acoustic wave propagation direction in order to reverse the national unidirectional property.

The invention described in the fifth aspect is the surface acoustic wave device according to the fourth aspect, wherein said langasite single crystal substrate is in the range of $-5° \leq \phi \leq 5°$, $135° \leq \theta \leq 145°$, and $20° \leq \psi \leq 30°$, when said single crystal substrate is described in ($\phi$, $\theta$, $\psi$) by Euler-angles viewing, or the equivalent orientation of this value.

The invention described in the second aspect is the surface acoustic wave device according to the fifth aspect, wherein, in the relationship of the distance between above-mentioned positive electrode finger, negative electrode finger and floating electrode finger, the distance between each center of said positive electrode finger and negative electrode finger is about $\lambda/2$, the width d of both electrode fingers is about $\lambda/4$, the distance g between each center of above-mentioned positive electrode finger and the electrode finger of above-mentioned floating electrode, which is one of the pair electrode fingers consisting of said floating electrode and is adjoining to said positive electrode finger in above-mentioned surface acoustic wave propagation direction, is $48\lambda/240 \leq g \leq 56\lambda/240$, so that above-mentioned floating electrode is formed unevenly in which each electrode finger of said one pair electrode fingers closes to the positive electrode finger or the negative electrode finger located at the adjoining left side.

The invention described in the seventh aspect is the surface acoustic wave device having the surface acoustic wave transducer, which is formed on the langasite single crystal substrate in which the substrate orientation and the surface acoustic wave propagation direction are selected to have the national unidirectional property, and have the positive electrode finger, which is arranged in the cycle of the wavelength A of the surface acoustic wave, and the 1st and 2nd negative electrode fingers, which are arranged on the one side of said positive electrode finger. Moreover, in the above-mentioned surface acoustic wave transducer, the each above-mentioned electrode is formed along the surface acoustic wave propagation direction so that natural unidirectional property may be reversed.

The invention described in the eighth aspect is the surface acoustic wave device according to the seventh aspects wherein the above-mentioned langasite single crystal substrate has the substrate orientation and the surface acoustic wave direction which are in the range of $-5° \leq \phi 5°$, $135° \leq \theta \leq 145°$ and $20° \leq \psi \leq 30$, or the equivalent to this values, when the substrate orientation and the surface acoustic wave propagation direction are described in ($\phi$, $\theta$, $\psi$) by Euler-angles viewing.

The invention described in the ninth aspect is the surface acoustic wave device according to the eighth aspect, wherein, in the position relationship of the 1 st and 2nd negative electrode fingers and the width of these electrode fingers, the width of the above-mentioned positive electrode finger is about $\lambda/8$, the distance d1 from the center of said positive electrode finger to the center of the 1st negative electrode finger, in which the electrode width W1 is in the range of $18/80\lambda \leq W1 \leq 20/80\lambda$, is $23/80\lambda \leq d1 \leq 25/80\lambda$, and furthermore, the distance d2 from the center of said positive electrode finger to the center of the 2nd negative electrode finger, in which the electrode width W2 is in the range of $20/80 \leq W2 \leq 26/80\lambda$, is $54/80\lambda$ d2 $\leq 55/80A$, when the wavelength of the surface acoustic wave is $\lambda$.

THE BEST FORM FOR THIS INVENTION

THE 1st EXAMPLE

Figure 1:
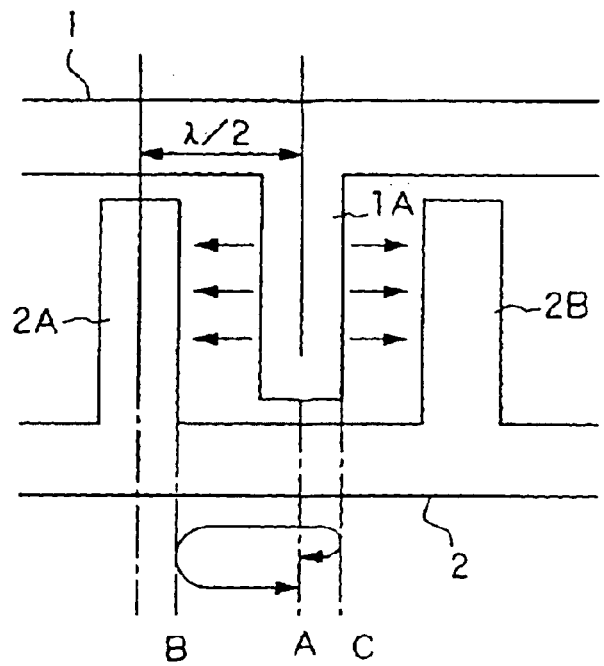
FIG. 1 is a schematic showing the electrode structure of a regular type IDT.

Hereafter, the 1st example of this invention is explained in detail by referring the drawings. First, the principle is explained by referring FIG. 1, wherein the natural unidirectional property is occurred, when the so-called regular type electrode (regular type IDT) is formed on the langasite piezoelectricity substrate, on which the multiple positive/negative electrode fingers, in which the electrode width and the distance between each electrode are $\lambda/4$, are arranged continuously and periodically, and is driven excitation. The schematic figure of the regular type electrode is shown in FIG. 1. In this figure, this regular type electrode consists of the positive electrode 1 and the negative electrode 2, and an electric fields are occurred between the positive electrode finger 1A, which constitutes positive electrode 1, and the negative electrode fingers 2A and 2B, which constitutes the negative electrode 2 being arranged on both side of this positive electrode finger 1A. At this time, the excitation center of the surface acoustic wave, which is generated on the langasite piezoelectricity substrate by exciting with this electric field, is nearly the center A of the positive electrode finger 1A.

Moreover, in this electrode structure, the electrode fingers which has the electrode width of $\lambda/4$ and are arranged periodically, becomes the source of the reflex of the surface acoustic wave. Since the reflex is originated in the discontinuity of the acoustic impedance, the surface acoustic wave is reflected at the edge of each electrode finger. Although the surface acoustic wave is reflected at two places of the both ends of the electrode fingers in this way, it can be thought that said wave is reflected equivalently at the center of the electrode finger. The phase of the reflected wave is changed at this time. This variation is dependent on the kind and the cut surface of the piezoelectric substrate, the surface acoustic wave propagation direction, and the kind of electrode materials and its thickness. For example, when a ST cut X propagation quart crystal is used as the piezoelectric substrate and A1 is used as the metallic material, the phase of the reflection wave is late with 90°, that is, the phase variation is 90°.

On the other hand, when the regular type IDT is formed, in which the langasite single crystal is used as the substrate, A1 is used as the electrode material, the phase variation of the surface acoustic wave reflected with the electrode fingers, becomes $-90+2\alpha$, wherein the langasite single crystal is in the range of $-5 \leq \phi \leq 5$, $135 \leq \theta \leq 145$ and $20 \leq \psi \leq 30$, or the equivalent orientation to this value in crystallography, when the substrate orientation and the surface acoustic wave propagation direction are described in ($\phi,\theta,\psi$) by Euler-angles viewing as the piezoelectric crystal. This $2\alpha$ is thought to be the phase shift at the time of the reflection, and if the reflective center is defined as the reflective center is shifted from the center of the electrode finger only with the amount being equivalent to this $2\alpha$, the shift $\delta$ of the reflective center, is shown with the formula (1).

$$\delta = (\alpha/2\pi)\lambda \quad (1).$$

When $\delta$ is positive, the reflective center is shifted to right side from the center of the electrode finger, and when $\delta$ is negative, the reflective center is shifted to left side.

When the shift of the reflective center and the center of the electrode finger, is $\lambda/8$, the phase at the point A of the wave excited with the positive electrode finger 1A, the wave reflected at the reflective center B of the negative electrode finger 2A, adjoining said electrode finger 1A, and the wave reflected at the edge C of said electrode finger 1A, is considered by using the FIG. 1 and, as a result, the phase at the point A, where the wave is reflected in the path of A→B→A, is shown with the formula (2).

$$-2\times 3\lambda/8\times 2\pi/\lambda - \pi/2 = -2\pi \quad (2)$$

This phase is the same phase as the excitation wave. On the other hand, the phase at the point A, where the wave reflected in the path of →C→A, is shown in the formula (3).

$$-2\times\lambda/8\times 2\pi/\lambda - \pi/2 = -\pi \quad (3)$$

This phase is the reverse phase to the excitation wave. For this reason, the surface acoustic wave will be driven strongly to right side of FIG. 1, and unidirectional property is realized.

Figure 2:
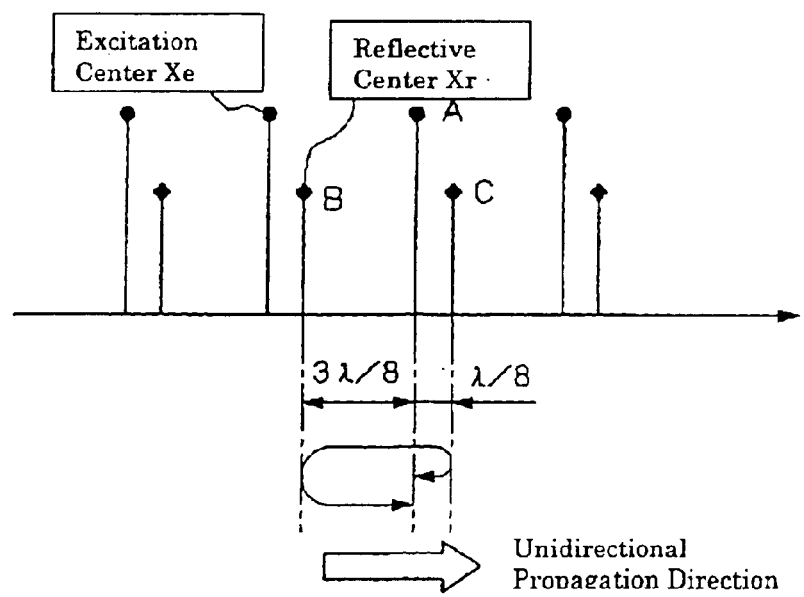
FIG. 2 is explanatory drawing showing the position relationship between the excitation center and the reflective center, for realizing unidirectional property by the regular type IDT shown in FIG. 1.

From the above mentioned reason, as shown in FIG. 2, when the distance between the excitation center and the reflective center becomes to the formula (4), it becomes possible to realize unidirectional property of the direction from the excitation center to the reflective center.

$$\lambda/8 + n\lambda/2 (n=0, 1, 2 \ldots) \quad (4)$$

That is to say, if the position of the excitation center and the reflective center can be specified, it can be concluded whether or not the surface acoustic wave transducer has unidirectional property, when the periodic electrode structure. (IDT), in which the surface acoustic wave can be excited, is formed on the arbitrary crystal. The position of this excitation center and the reflective center, is described by the mode coupling parameter, when a mode coupling theory is used.

The mode coupling parameter consists of the self coupling coefficient $\kappa_{11}$, the mode coupling coefficient $\kappa_{12}$, excitation coefficient $\xi$, and electrostatic capacitance C. Here, the mode coupling coefficient $\kappa_{12}$ is expressed as the formula (5), and is equivalent to the shift of the reflective center from base level, and the amount of said shift is expressed with formula (1).

$$\kappa_{12} = |\kappa_{12}|e^{j2\alpha} \quad (5)$$

Moreover, excitation coefficient $\xi$, is formula (6) and it may be considered that the excitation center is at the place where is separated only with the formula (7) from base level.

$$\xi = |\xi|e^{j\beta} \quad (6)$$

$$\gamma = (\beta/2\pi)\lambda \quad (7)$$

Therefore, it may be in the relation of formula (8), between the phases of the mode coupling coefficient $\kappa_{12}$ and excitation coefficient $\xi$, so that the difference between the reflec tive center and the excitation center may fulfill the formula (4).

$$\alpha - \beta = \pi/4 + n\pi (n: 0, 1, 2 \ldots) \quad (8)$$

Here, the result analyzed from the mode coupling theory is shown, wherein the unidirectional reversion electrode structure (it is called TCS-RDT: Tranduction Center Shift type Reversal of Directivity Transducer structure), which is proposed by Mr. Takeuchi in Tokukai Hei 8-125484, and the position of the excitation center and reflective center in the surface acoustic wave device of the example of this invention, are analyzed. The sectional plane and the propagation direction of the langasite substrate are describe here in (0°,140°,24°) by the Euler-angles viewing. Moreover, Al is used as the electrode material. TCS-RDT structure is shown in FIG. 3 and the electrode structure of the surface acoustic wave device of the example of this invention, is shown in FIG. 4.

Figure 3:
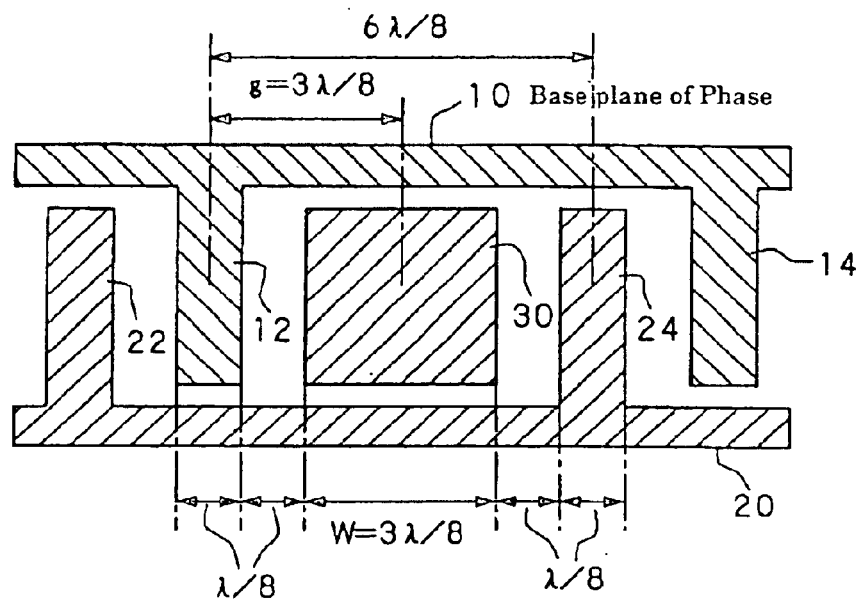
FIG. 3 is a schematic showing IDT of the conventional TCS-RDT structure.

In FIG. 3, the electrode of the TCS-RDT structure consists of the positive electrode 10, the negative electrode 20, and both the electrode widths of the positive electrode fingers 12 and 14, which constitute said positive electrode 10, and the negative electrode fingers 22 and 24, which constitute said negative electrode 20, are $\lambda/8$, and the distance between each center of the positive electrode finger 12 and the negative electrode finger 24, is $6\lambda/8$. Moreover, the electrode width of the floating electrode 30, which is prepared between the positive electrode finger 12 and the negative electrode finger 24, is $3\lambda/8$, and the distance g between the centers of the positive electrode finger 12 and the floating electrode 30, is $3\lambda/8$.

Figure 4:
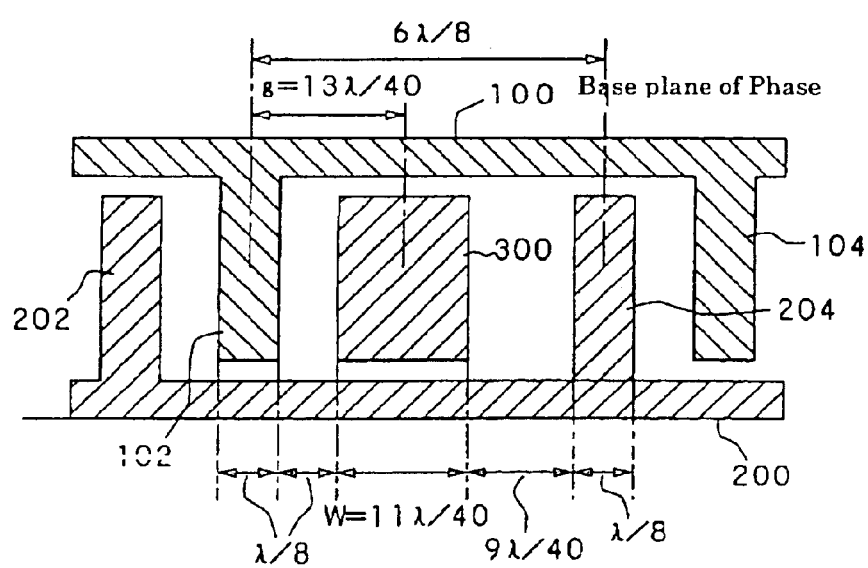
FIG. 4 is a schematic showing the electrode structure of IDT which is used in the surface acoustic wave device of the example of this invention.

On the other hand, the electrode of the surface acoustic wave transducer, which is used in the surface acoustic wave device of the example of this invention, consists of the positive electrode 100 and the negative electrode 200, as shown in FIG. 4. Both of the electrode widths of the positive electrode fingers 102 and 104, which constitute the positive electrode 100, and the negative electrode fingers 202 and 204, which constitute the negative electrode 200, are $\lambda/8$. In addition, the distance between each center of the positive electrode finger 102 and the negative electrode finger 204, is $6\lambda/8$. Moreover, the electrode width of the floating electrode 300, which is prepared between the positive electrode finger 102 and the negative electrode finger 204, is $11\lambda/40$, and the distance g between centers of the positive electrode finger 102 and the floating electrode 300, is $13\lambda/40$.

Moreover, in FIG. 3 and FIG. 4, the base levels of the phase of excitation coefficient $\xi$ and the mode coupling coefficient $\kappa_{12}$ are both centers of the negative electrode finger 24 and 204 having the width of $\lambda/8$.

Figure 5:
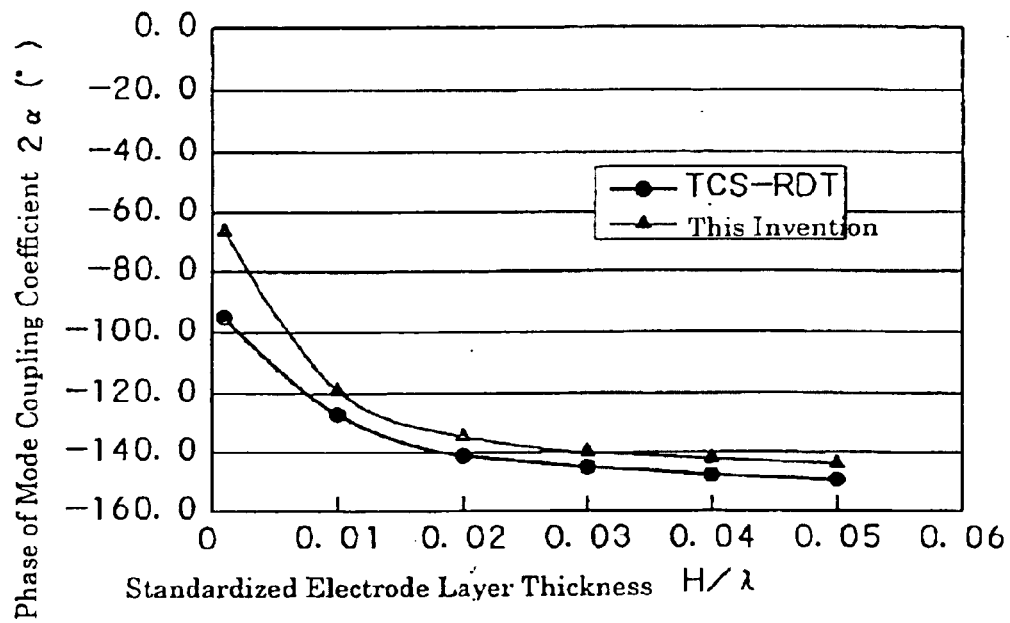
FIG. 5 is the characteristic figure showing the electrode layer thickness dependency of the phase term of the mode coupling coefficient $\kappa_{12}$.
Figure 6:
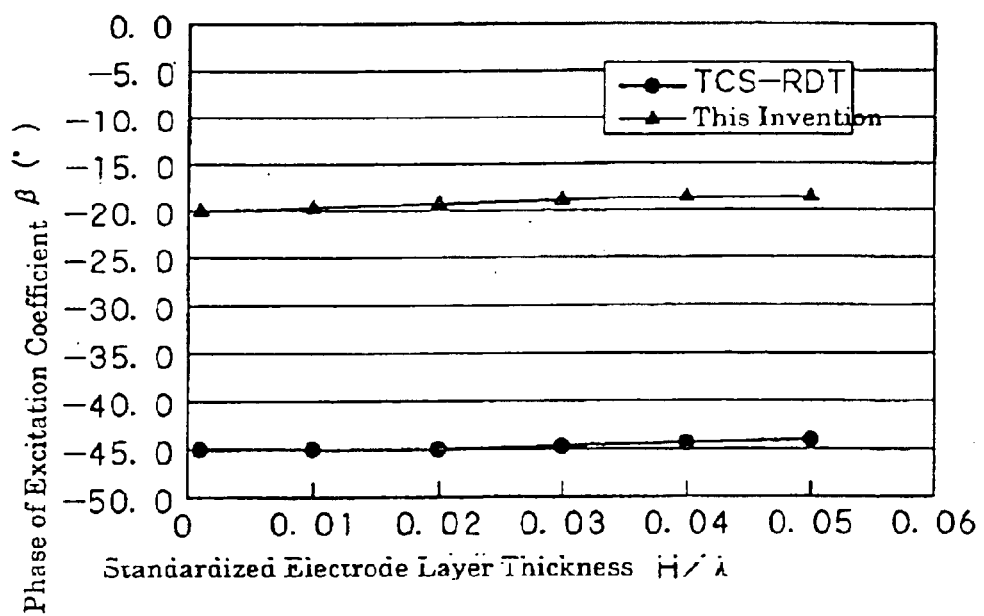
FIG. 6 is the characteristic figure showing the electrode layer thickness dependency of the phase term of the excitation coefficient $\xi$.
Figure 7:
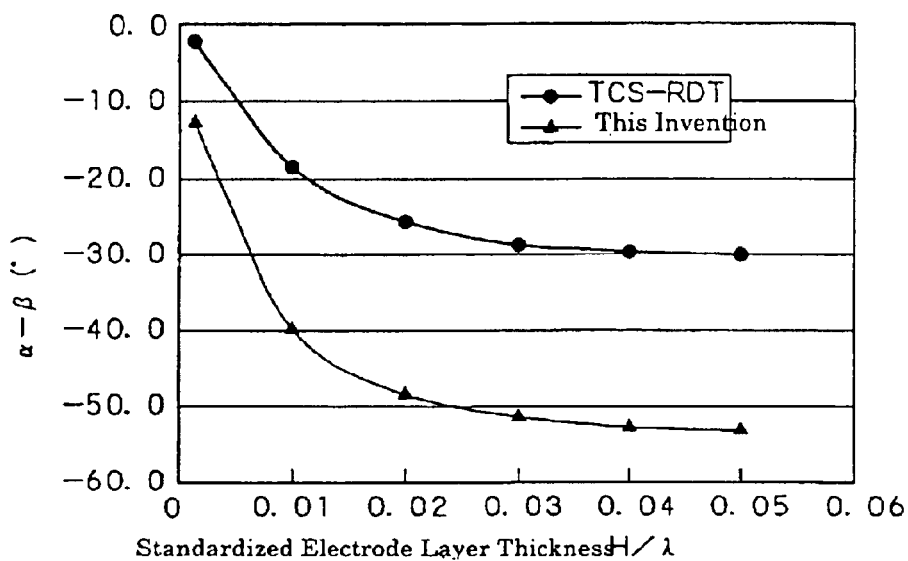
FIG. 7 is the characteristic figure showing the electrode layer thickness dependency of the phase difference ($\alpha-\beta$) of the mode coupling coefficient, and the excitation coefficient.

In addition, the electrode layer thickness dependency of the phase term $2\alpha$, is shown in FIG. 5, wherein $2\alpha$ is the phase term of the mode coupling coefficient $\kappa_{12}$ of the electrode structure of the surface acoustic wave transducer, which is used in the surface acoustic wave device of the form of the TCS-RDT structure and the example of this invention. Moreover, the electrode layer thickness dependency of phase term $\beta$, is shown in FIG. 6, wherein $\beta$ is the phase term of the excitation coefficient $\xi$ of the TCS-RDT structure and the electrode structure of this invention. The electrode layer thickness dependency of the phase difference $(\alpha - \beta)$ between the excitation coefficient $\xi$ and the mode coupling coefficient $\kappa_{12}$, is shown in FIG. 7. The meaning that code of the phase difference $(\alpha - \beta)$ indicates negative, is that the direction of the unidirectional property of the TCS-RDT structure is the reverse direction to the direction of the natural unidirectional property. From this result, it is said that in the TCS-RDT structure, when the standardization electrode layer thickness H/λ (H is the electrode thickness) is changed between 0 and 0.05, the magnitude of the phase difference (α-β) is varied to -30° from near 0°, and does not reach to -45, which is the angle which optimizes unidirectional property, as clearly shown from the formula (8). On the other hand, by using the electrode structure of the example of this invention, when the standardization thickness is about 0.013, it can be understand that the phase difference (α-β) is -45°, which optimizes unidirectional property.

Figure 8:
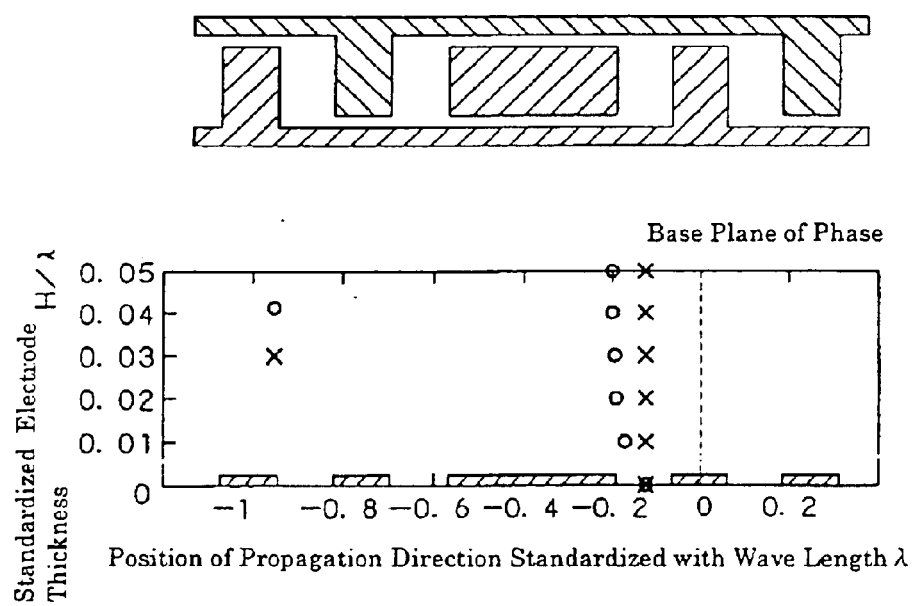
FIG. 8 is the characteristic figure showing the electrode layer thickness dependency of the positions of the excitation center and the reflective center, in IDT of the TCS-RDT structure.
Figure 9:
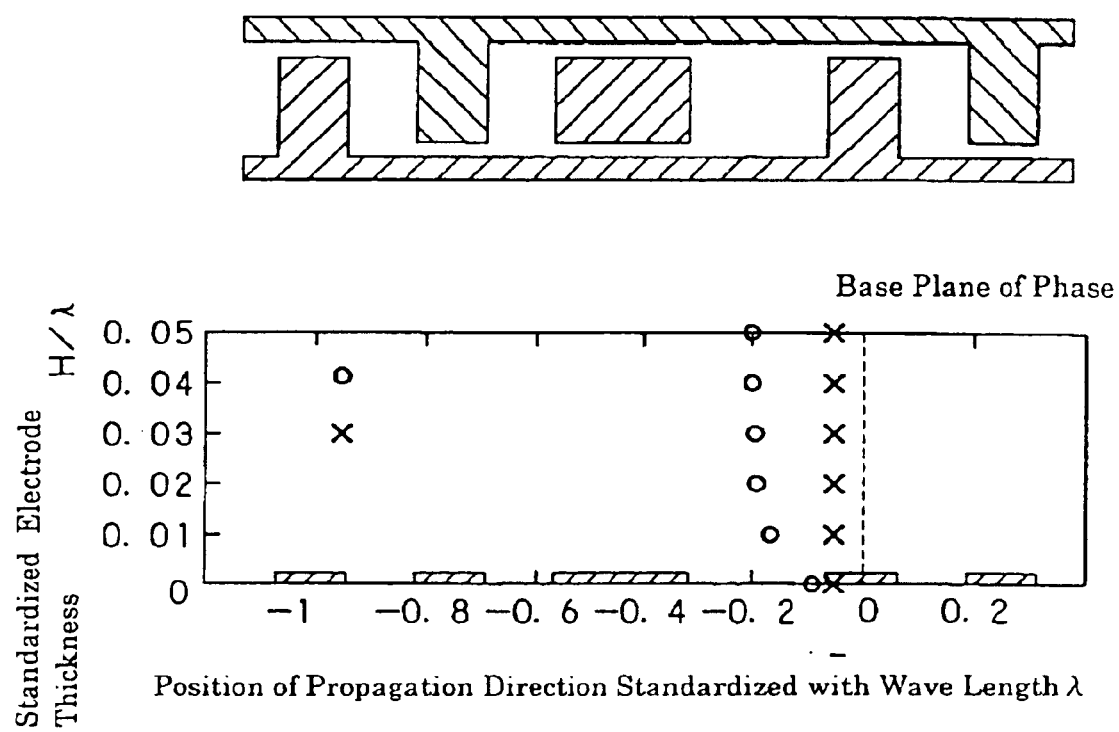
FIG. 9 is the characteristic figure showing the electrode layer thickness dependency of the positions of the excitation center and the reflective center in IDT which is used in the surface acoustic wave device of the example of this invention.

On the basis of the result of FIG. 3 and FIG. 4, the electrode layer thickness dependency about the position of the excitation center and the reflective center, to the TCS-RDT structure (FIG. 3), is shown in FIG. 8. The electrode layer thickness dependency about the position of the excitation center and the reflective center, to the electrode structure (FIG. 4) of the surface acoustic wave transducer, which is used for the surface acoustic wave device of the example of this invention, is shown in FIG. 9. In each figure of FIG. 8 and FIG. 9, the schematic of the electrode structure, is shown in the upside, and the sectional drawing of the electrode structure is shown in the lower graph, in order to clarify the position relationship of the surface acoustic wave propagation direction. Moreover, in these figures, the reflective center is shown with O and the excitation center is shown with X.

As shown in FIG. 9, in the electrode structure of the surface acoustic wave transducer, which is used in the surface acoustic wave device of the example of this invention, since the reflective center is existed in the left side to the excitation center, and the distance between the both centers is about λ/8, it can be understand that the direction of unidirectional property is at the left side on this figure, and unidirectional property is reversed to the direction of natural unidirectional property.

Moreover, about the distance relationship between the above-mentioned positive electrode finger, the negative electrode finger, and the floating electrode, in the surface acoustic wave transducer, when the wavelength of the surface acoustic wave is λ, the width of the above mentioned positive electrode finger and the negative electrode finger, is about λ/8, the distance between each center of both electrode fingers is about 6/8λ, and the distance g between each center of the positive electrode finger and the floating electrode, is 13/40λ≦g≦14/40λ. In addition, if the width W of the floating electrode is 11/40λ≦W≦13/40λ, the unidirectional property can be reversed to the direction of natural unidirectional property.

Figure 10:
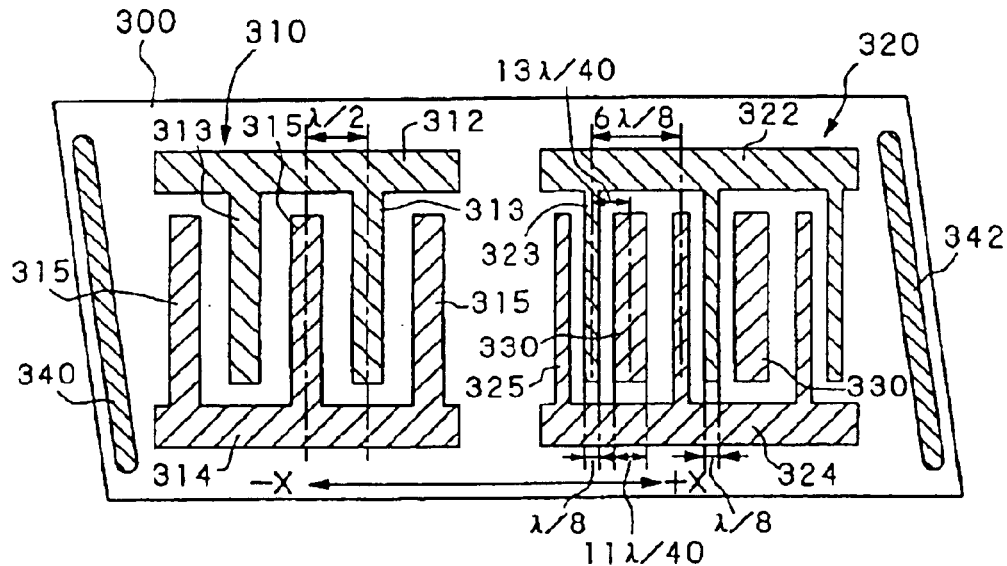
FIG. 10 is a schematic showing the structure of the transmitting type surface acoustic wave filter, which is applied with this invention.

Next, two kinds of the prototype of the transmitting surface acoustic wave filter, which was constituted by using the electrode structure of the surface acoustic wave transducer used in the surface acoustic wave device of the example of this invention, were made, and the result of these properties examined is shown. The cut surface/propagation direction of the used langasite substrate, is described in (0°, 140°, 24°) by Euler-angles viewing. Moreover, A1 was used as the electrode material. The structure of the 1st transmitting type surface acoustic wave filter (it is described as filter #1), as the test sample, is shown in FIG. 10. In this figure, on the langasite substrate 300, the regular type IDT310 as the transmitting electrode and IDT320 as the receiving electrode are formed along the surface acoustic wave propagation direction (the direction of +X). The regular type IDT310 consists of the positive electrode 312 and the negative electrode 314, and the positive electrode finger 313 and the negative electrode finger 315, in which both width of the electrode and the distance between said electrodes are λ/4, are formed to be arranged continuously and periodically, to realize unidirectional property by using NPUDT characteristics.

Moreover, IDT320 as the receiving electrode is used the electrode structure of this invention, and consists of the positive electrode 322, the negative electrode 324, and the floating electrode 330. In here, the electrode width of the positive electrode finger 323 and the negative electrode finger 325, is λ/8, and the distance between each center of both electrode fingers 323 and 325 is 6λ/8. In addition, the distance g between each center of the positive electrode fingers 323 and the floating electrode 330, is 13λ/40, and the width W of the floating electrode 330 is 11λ/40. The structure of this receiving electrode is the same structure as shown in FIG. 4.

In the 2nd transmitting type the surface acoustic wave filter as the test sample 2 (it is described as the filter #2.), the same regular type IDT as the transmitting type surface acoustic wave filter of the above-mentioned 1st is used as the transmitting electrode, and the IDT of the TCS-RDT structure shown in FIG. 4, is used as the receiving electrode. Both filters are arranged to be countered with the unidirectional property of the transmitting and receiving electrodes, as shown in FIG. 10. Moreover, on both endpoints of the langasite substrate 300, the damper agent 340 is applied, in order to absorb the reflex of the surface acoustic wave at the edges. The cycle length λ of the electrode fingers of filter #1 and #2, is 32.15 μm, and the A1 thickness of the electrode is 500 nm (5000 Å). The thinning weighting is given, in the transmitting and receiving electrodes.

Figure 11:
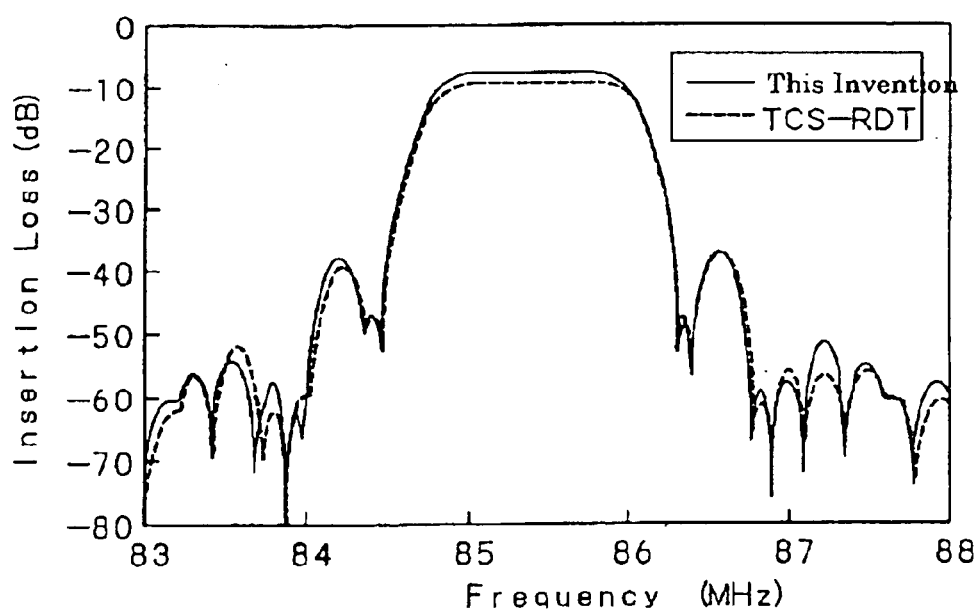
FIG. 11 is the characteristic figure showing the frequency characteristic of the transmitting type surface acoustic wave filter which is applied with this invention, and the transmitting type surface acoustic wave filter which is used IDT of the TCS-RDT structure as the receiving electrode.
Figure 12:
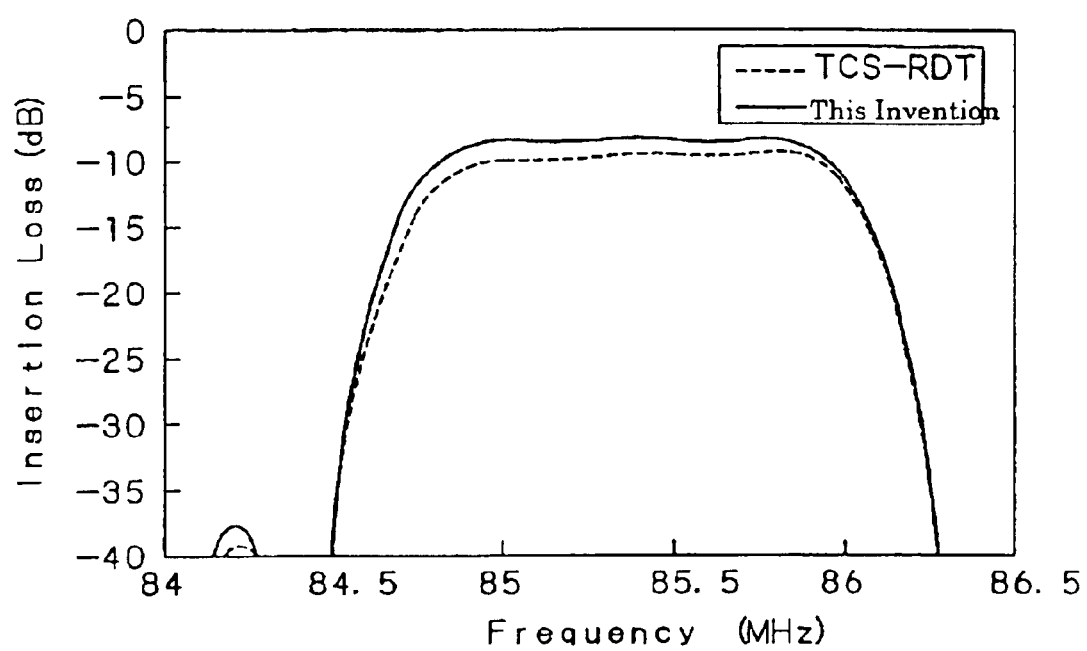
FIG. 12 is the characteristic figure which is expanded near the transit region of the filter in the frequency characteristic shown in FIG. 11.

The measurement result of the frequency characteristic of the filter #1 and the filter #2, is shown in FIG. 11 and FIG. 12. FIG. 12 is the figure, which is expanded at near transit region of the filter in the frequency characteristic shown in FIG. 11. FIG. 11 and 12 show that the pass-band insertion loss, the ripple in the band, and the retardation ripple in the band, of this invention filter, are improved. As specifically shown in Table 1, as for the pass band insertion loss, the filter #2 is -9.0 dB to the filter #1 being 8.0 dB, and as for the ripple in the band, the filter #2 is 0.58 to the filter #1 being 0.24 dB. Moreover, as for the retardation ripple in the band, the filter #2 is 80.0 ns to the filter #1 being 69.5 ns.

THE 2nd EXAMPLE

Hereafter, the 2nd example of this invention, is explained in detail by referring the drawings. First, the principle is explained by referring FIG. 1, in which the natural unidirectional property is occurred, when the so-called regular type electrode (regular type IDT) is formed on the langasite piezoelectricity substrate, on which the multiple positive/negative electrode fingers, in which the electrode width and the distance between each electrode are λ/4, are arranged continuously and periodically, and are driven excitation. The schematic figure of the regular type electrode, is shown in FIG. 1. In this figure, this regular type electrode consists of the positive electrode 1 and the negative electrode 2, and the electric field are occurred, between the positive electrode finger 1A which constitutes the positive electrode 1, and the negative electrode fingers 2A and 2B, which constitute the negative electrode 2, which is arranged on both side of this positive electrode finger 1A. At this time, the excitation center of the surface acoustic wave, which is generated on the langasite piezoelectricity substrate, by exciting with this electric field, is nearly the center A of the positive electrode finger 1A.

Moreover, in this electrode structure, the electrode fingers which have λ/4 of the electrode width, and are arranged periodically, become the source of the reflex of the surface acoustic wave. Since the reflex is originated in the discontinuity of the acoustic impedance, the surface acoustic wave is reflected at the edge of each electrode finger. Although, the surface acoustic wave is reflected at two places of both ends of the electrode finger in this way, it can be thought that said wave is reflected equivalently at the center of the electrode finger. The phase of the reflected wave is changed at this time. This variation depends on the kind and the cut surface of the piezoelectric substrate, the surface acoustic wave propagation direction, and the kind of electrode materials and its thickness. For example, when the ST cut X propagation quart crystal is used as the piezoelectric substrate, and A1 is used as the metallic material, the phase of the reflection wave is late with 90°, that is, the phase variation is 90°.

On the other hand, when the regular type IDT is formed, in which the langasite single crystal is used as the substrate, A1 is used as the electrode material, the phase variation of the surface acoustic wave reflected with the electrode finger, becomes $-90°+2\alpha$, wherein the langasite single crystal, is within the range of $-5° \leq \phi \leq 5°, 135° \leq \theta \leq 145°$ and $20° \leq \psi \leq 30°$, or the equivalent orientation to this value in crystallography, when the substrate orientation and the surface acoustic wave propagation direction are described in ($\phi$, $\theta$, $\psi$) by Euler-angles viewing as the piezoelectric crystal. This $2\alpha$ is considered to be the phase shift at the time of the reflex, and if the reflective center is defined, as the reflective center is shifted from the center of the electrode finger only with the amount being equivalent to this $2\alpha$, the shift $\delta$ of the reflective center, is shown with the formula (1).

$$\delta = (\alpha/2\pi)\lambda \qquad (1)$$

When $\delta$ is positive, the reflective center is shifted to the right side from the center of the electrode finger, and when $\delta$ is negative, the center is shifted to the left side.

When the shift of the reflective center and the electrode finger center is $\lambda/8$, the phase at the point A of the wave driven with excitation at the positive electrode finger 1A, the wave reflected at the reflective center B of the negative electrode finger 2A adjoining said electrode finger 1A, and the wave reflected at the edge C of the said electrode finger 1A, are considered by using FIG. 1 and as a result, the phase at the point A of the wave reflected in the path of A→B→A, is shown in the formula (2).

$$-2 \times (3\lambda/8) \times 2\pi/\lambda - \pi/2 = -2\pi \qquad (2)$$

This is the same phase as the excitation wave. On the other hand, the phase at the point A of the wave reflected in the path of A→C→A, is shown in the formula (3).

$$-2(\lambda/8) \times 2\pi/\lambda - \pi/2 = -2\pi \qquad (3)$$

This phase is the reverse phase to the excitation wave. For this reason, the surface acoustic wave will be excited at the right side of FIG. 1 strongly, and unidirectional property is realized.

From the above mentioned reason, as shown in FIG. 2, when the distance between the excitation center and the reflective center, becomes to the formula (4), it becomes possible to realize unidirectional property of the direction from the excitation center to the reflective center.

$$\lambda/8 + n\lambda/2 (n=0.1.2 \ldots) \qquad (4)$$

That is, if the position of the excitation center and the reflective center can be specified, it can be concluded whether or not the surface acoustic wave transducer has unidirectional property, when the cyclic electrode structure (IDT), in which the surface acoustic wave can be excited, is formed on the arbitrary crystal. The position of this excitation center and the reflective center, is described by the mode coupling parameter when the mode coupling theory is used.

The mode coupling parameter consists of the self coupling coefficient, the mode coupling coefficient, the excitation coefficient, and the electrostatic capacitance C. Here, the mode coupling coefficient $\kappa_{12}$, is expressed as the formula (5) and the phase of $\kappa_{12}$ is equivalent to the shift of the reflective center from base level, and said shift is expressed with formula (1).

$$\kappa_{12} = |\kappa_{12}| e^{j2\alpha} \qquad (5)$$

Moreover, the excitation coefficient $\xi$, is formula (6) and it may be considered that the excitation center is situated at the place where is separated with only formula (7) from base level.

$$\xi = |\xi| e^{j\beta} \qquad (6)$$

$$\gamma = (\beta/2\pi)\lambda \qquad (7)$$

Therefore, it may be in the relationship of formula (8), between the phase of the mode coupling coefficient $\kappa_{12}$, and excitation coefficients, so that the difference between the reflective center and the excitation center may fulfill formula (4).

$$\alpha - \beta = \pi/4 + n\pi (n=0.1.2 \ldots) \qquad (8)$$

Here, the result analyzed from the mode coupling theory, is shown, wherein the unidirectional reversion electrode structure (it is hereafter called an EWD-RDT structure), which is proposed by Mr. Takeuchi in the Tokukai hei 8-204492, and the position of the excitation center, and the reflective center in the surface acoustic wave device of the example of this invention, are analyzed. The sectional plane and the propagation direction of the langasite substrate are described here in (0°, 140°, 24°) by Euler-angles viewing. Moreover, A1 is used as the electrode material. EWD-RDT structure is shown in FIG. 13, and the electrode structure of the surface acoustic wave device of the example of this invention, is shown in FIG. 14.

Figure 13:
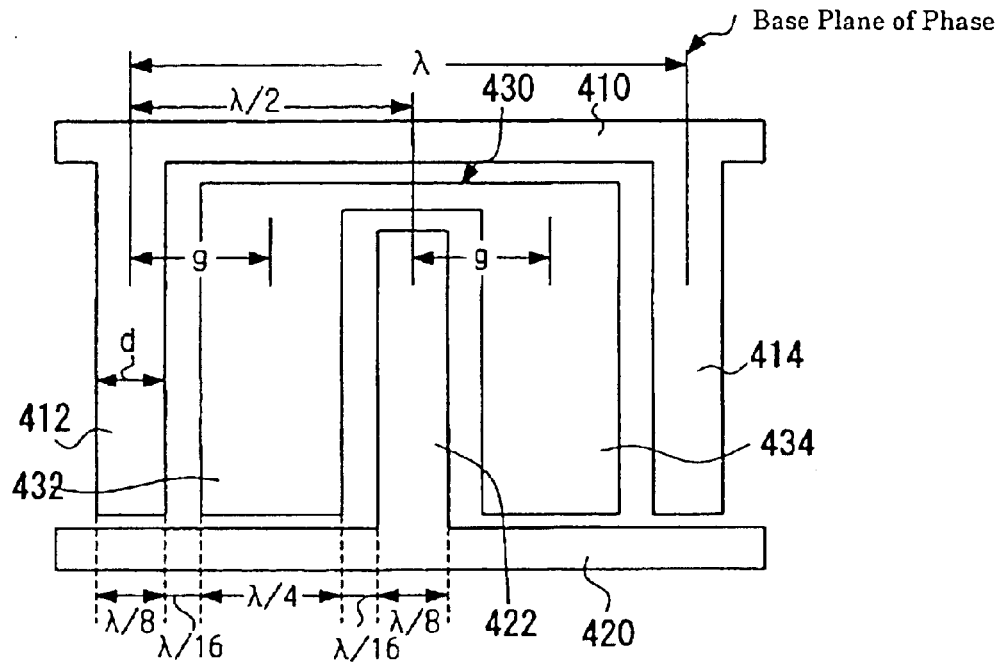
FIG. 13 is a schematic showing IDT of the conventional EWD-RDT structure.

In FIG. 13, the electrode of the EWD-RDT structure consists of the positive electrode 410, the negative electrode 420, and the floating electrode 430, and both of the electrode widths of the positive electrode fingers 412 and 414, which constitute the positive electrode 410, and the negative electrode finger 422, which constitute the negative electrode 420, are $\lambda/8$, and the distance between the each center of the positive electrode finger 412 and the negative electrode finger 422, is $\lambda/2$. Moreover, the electrode fingers which has the width of $\lambda/4$, is between the positive electrode finger and the negative electrode finger. For example, the floating electrode 430 is formed, wherein the electrode fingers 432 and 434, which are the adjoining one pair, are short-circuited, and the distance between each edge of the positive electrode finger 412, 414 or the negative electrode finger 422, and the floating electrode 430, is $\lambda/16$.

Figure 14:
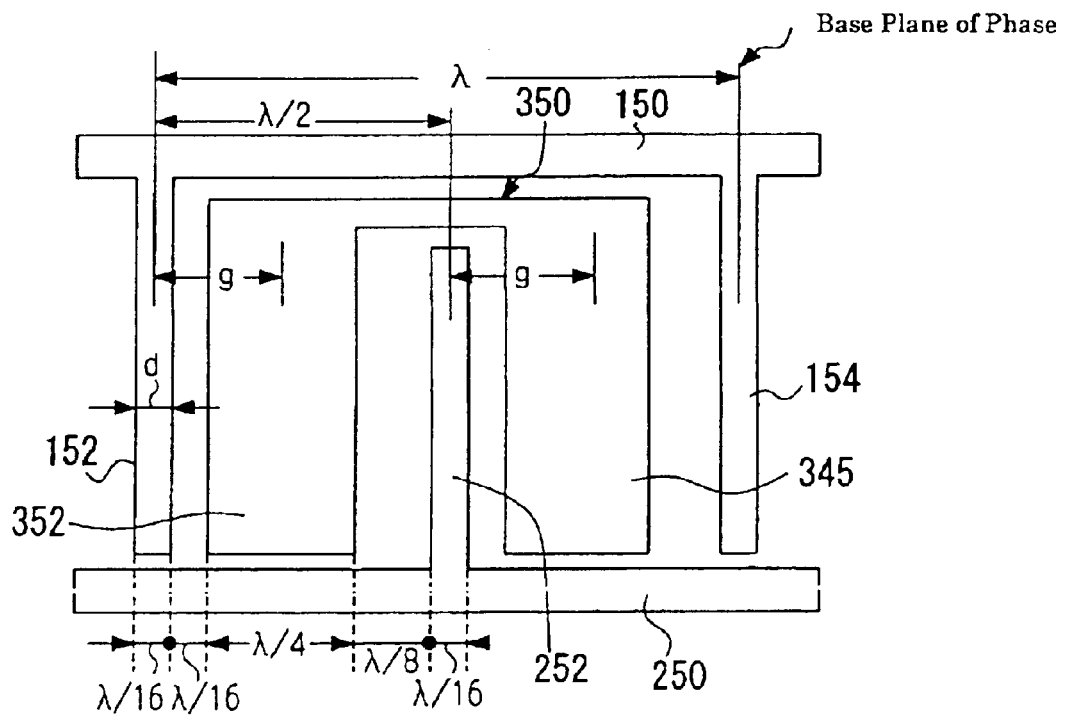
FIG. 14 is a schematic showing the electrode structure of IDT which is used in the surface acoustic wave device of the example of this invention.

On the other hand, the electrode of the surface acoustic wave transducer, which is used for the surface acoustic wave device of the example of this invention, consists of the positive electrode 150, the negative electrode 250, and the floating electrode 350, as shown in FIG. 14. Both of the electrode widths of the positive electrode finger 152,154, which constitute the positive electrode 150, and the negative electrode finger 252, which constitutes the negative electrode 250, are λ/16. The distance between the positive electrode finger 152 and the negative electrode finger 252, is λ/2. Moreover, the floating electrode 350 is formed, wherein one pair of electrode fingers 352 and 354 is formed to short-circuit with straddling over the negative electrode finger 252 between the positive electrode finger 152 and the positive electrode finger 154, and the width of said electrode fingers 352 and 354 is λ/4, and the distance g between the each center of the positive electrode finger 152 and the electrode finger 352, is 7λ/32, wherein the said electrode finger 352 is one of said pair electrodes 352 and 354, which constitutes said floating electrode 350, and adjoins the positive electrode finger 152 in the surface acoustic wave propagation direction.

Moreover, in FIG. 13 and FIG. 14, the base levels of the phase of excitation coefficient ξ and the mode coupling coefficient $\kappa_{12}$, are the centers of the positive electrode finger 414 having λ/8 of width, and the positive-electrode finger 154 having λ/16 of width.

Figure 15:
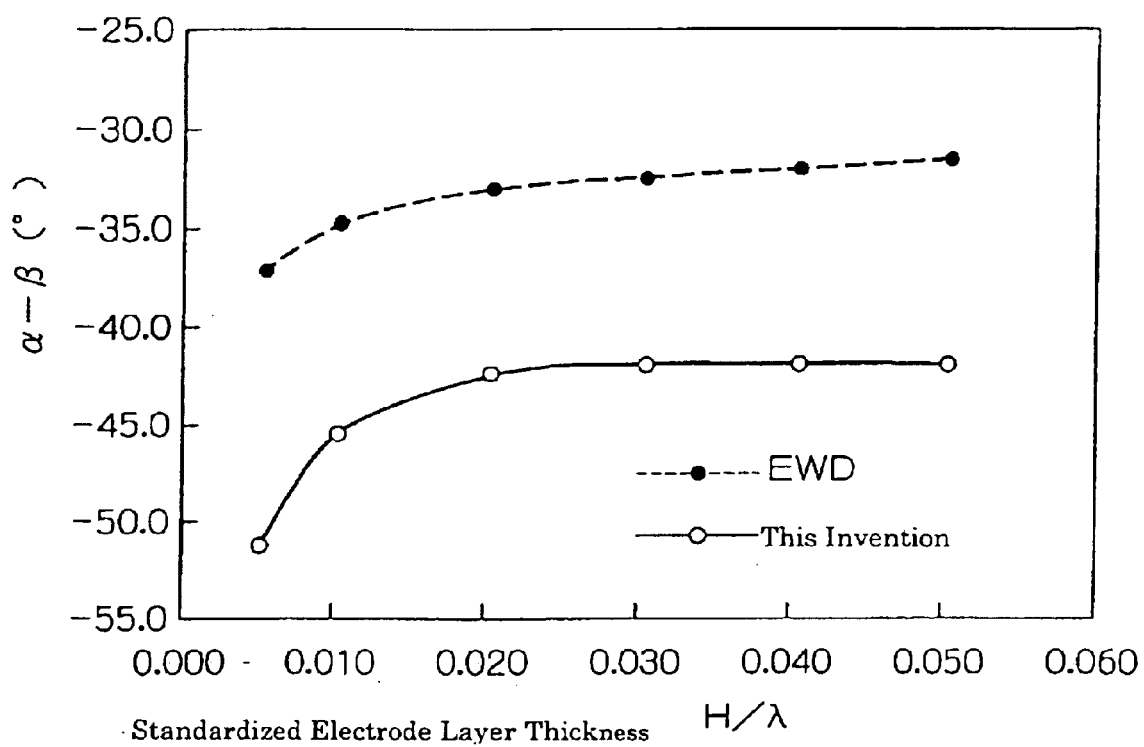
FIG. 15 is the characteristic figure showing the electrode layer thickness dependency of the phase difference ($\alpha-\beta$) of the mode coupling coefficient, and the excitation coefficient.

Next, the electrode layer thickness dependency of the phase difference (α–β) between the excitation coefficient ξ and the mode coupling coefficient, is shown in FIG. 15. The meaning, that the code of the phase difference (α–β) indicates negative, is that the direction of the unidirectional property of the EWD-RDT structure, is the reverse direction to the direction of the natural unidirectional property. From this result, it is said that in the EWD-RDT structure, when the standardization electrode layer thickness H/λ (H is the electrode thickness) is changed between 0 and 0.05, the magnitude of the phase difference (α–β) is varied to –32° from near –37.5°, and does not reach to –45°, which is the optimum angle for unidirectional property, as clearly shown from the formula (8). On the other hand, by using the electrode structure of the example of this invention, when the standardization thickness is about 0.012, it can be understood that the phase difference (α–β) is –45° which optimizes unidirectional property.

Figure 16:
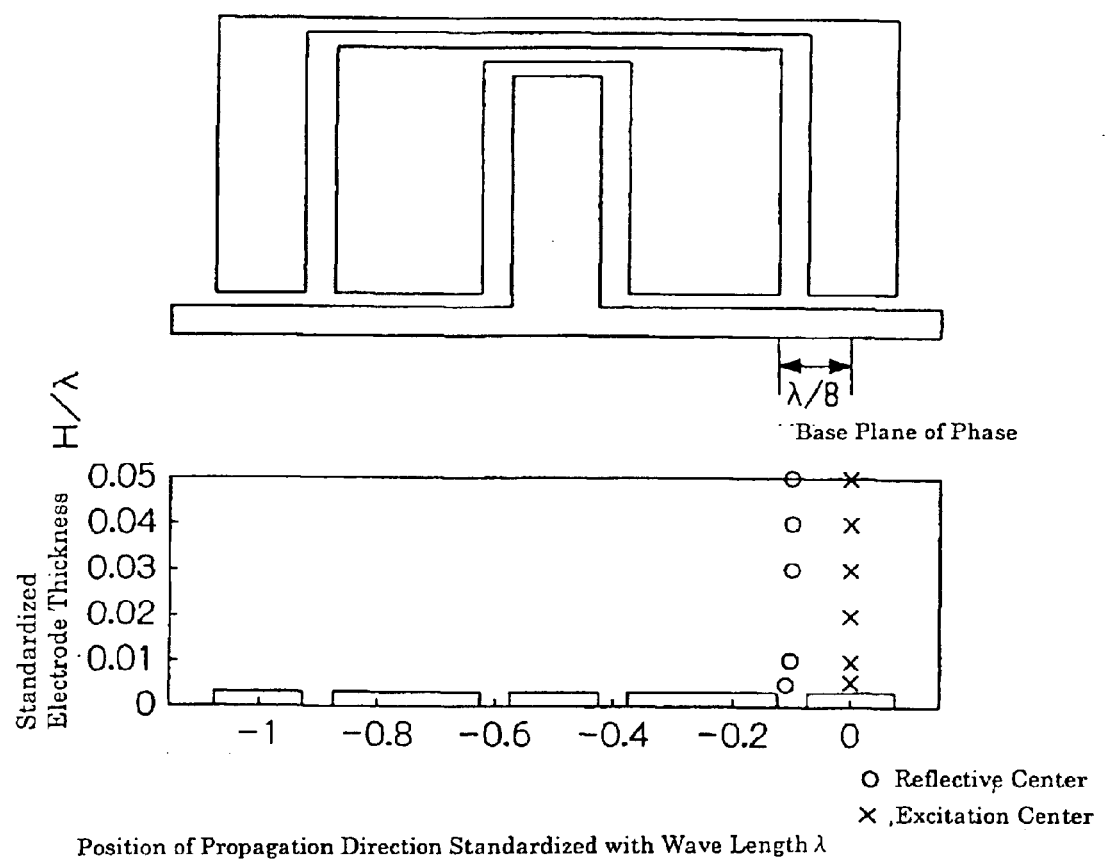
FIG. 16 is the characteristic figure showing the electrode layer thickness dependency of the position of the excitation center and the reflective center in IDT of the EWD-RDT structure.
Figure 17:
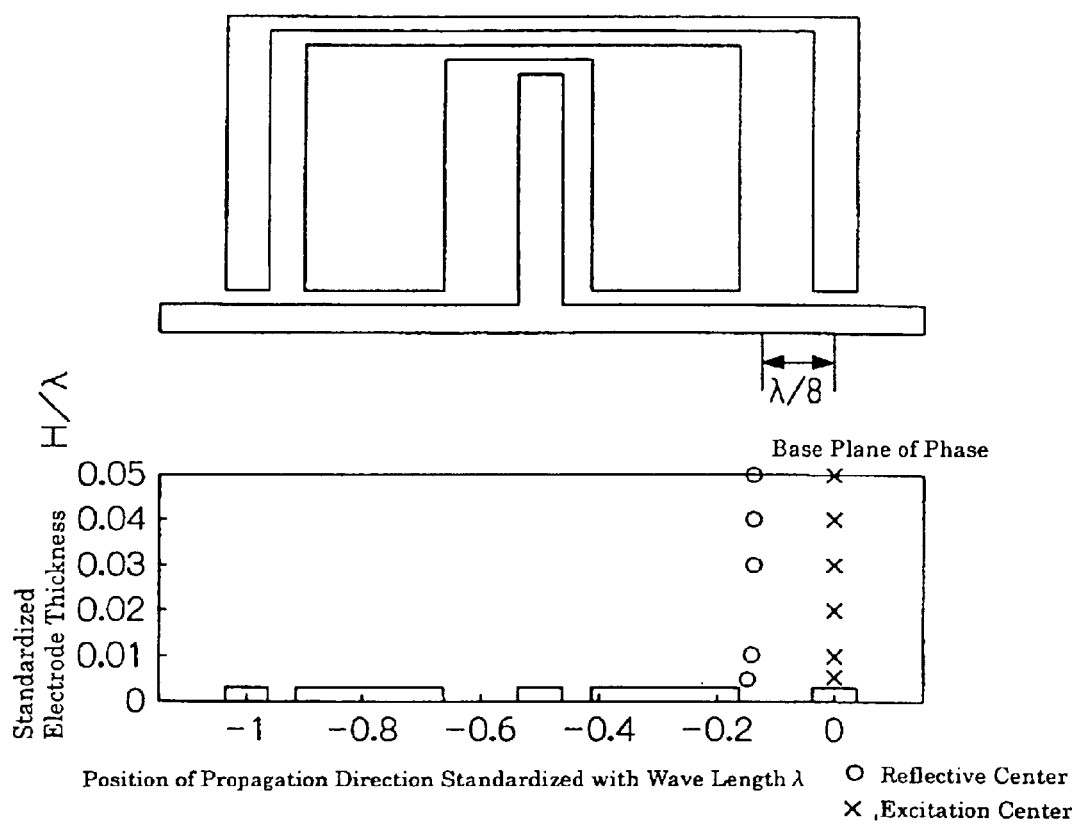
FIG. 17 is the characteristic figure showing the electrode layer thickness dependency of the position of the excitation center and the reflective center in IDT which is used in the surface acoustic wave device of the example of this invention.

On the basis of the result of FIG. 13 and FIG. 14, the electrode layer thickness dependency about the positions of the excitation center and the reflective center, to the EWD-RDT structure (FIG. 13), is shown in FIG. 16. The electrode layer thickness dependency about the positions of the excitation center and the reflective center, to the electrode structure (FIG. 14) of the surface acoustic wave transducer, which is used for the surface acoustic wave device of the example of this invention, is shown in FIG. 17. In each figure of FIG. 16 and FIG. 17, the schematic of the electrode structure, is shown in the upside, and the sectional drawing of the electrode structure, is shown in the lower graph, in order to clarity the position relationship of the propagation direction of the surface acoustic wave. Moreover, in these figures, the reflective center is shown with O, and the excitation center is shown with X.

As shown in FIG. 17, in the electrode structure of the surface acoustic wave transducer, which is used for the surface acoustic wave device of the example of this invention, the reflective center is existed in the left side to the excitation center, and since the distance between both centers is about λ/8, it can be understood that the direction of the unidirectional property is the left side on this figure, and is reversed to the direction of natural unidirectional property.

Figure 21:
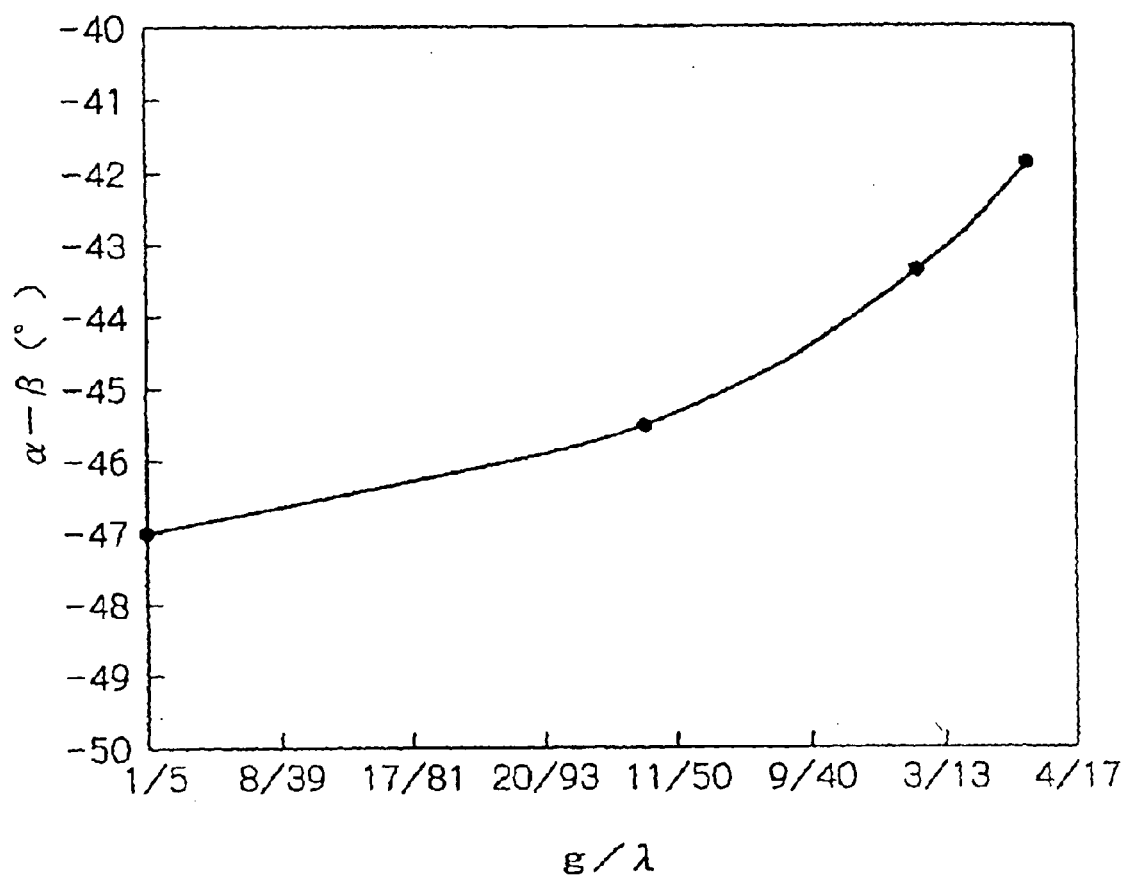
FIG. 21 is the characteristic figure showing the dependency of the phase difference ($\alpha-\beta$) of the mode coupling coefficient and the excitation coefficient, to the ratio $g/\lambda$, in which $\lambda$ is the wavelength of the surface acoustic wave and $g$ is the distance between each center of the positive electrode finger and the floating electrode, in the surface acoustic wave transducer.

Moreover, the characteristics about g/λ dependency of the phase difference (α–β) between the excitation coefficient ζ and the mode coupling coefficient is shown in FIG. 21, wherein the distance g is the distance between each center of the positive electrode finger of the surface acoustic wave transducer and the electrode finger of the floating electrode, which is one of the pair electrodes constituting the floating electrodes and adjoins said positive electrode finger in the surface acoustic wave propagation direction, and λ is the wavelength of the surface acoustic wave. As shown in this figure, it can be understood that the phase difference (α–β) becomes –45°, which is the optimum angle for reversing unidirectional property, when g/X is in the range of 48/240≦g/λ≦56/240.

Moreover, wherein in the distance relationship between the above-mentioned positive electrode finger, the negative electrode finger, and the floating electrode, in the surface acoustic wave transducer, when wavelength of the surface acoustic wave is λ, the distance between each center of the above-mentioned positive electrode finger and the negative electrode finger is about λ/2, the width d of both electrode finger is λ/20≦d≦λ/10, the width W of the electrode finger of the above-mentioned floating electrode is about λ/4, and the distance g between each center of the above-mentioned positive electrode finger, and the center of the electrode finger of the above-mentioned floating electrode is 48λ/240≦g≦56λ/240, wherein said electrode finger of the above-mentioned floating electrode is one of the pair electrode fingers, which constitute the above-mentioned floating electrode, and adjoins said positive electrode finger in the above-mentioned surface acoustic wave propagation direction. In addition, in the above-mentioned floating electrode, when each electrode finger of the above-mentioned pair is formed aside to be close to the positive electrode finger or negative electrode finger, which is in the left side of said electrode finger, the above-mentioned floating electrode can reverse the unidirectional property, to the direction of the natural unidirectional property.

Figure 18:
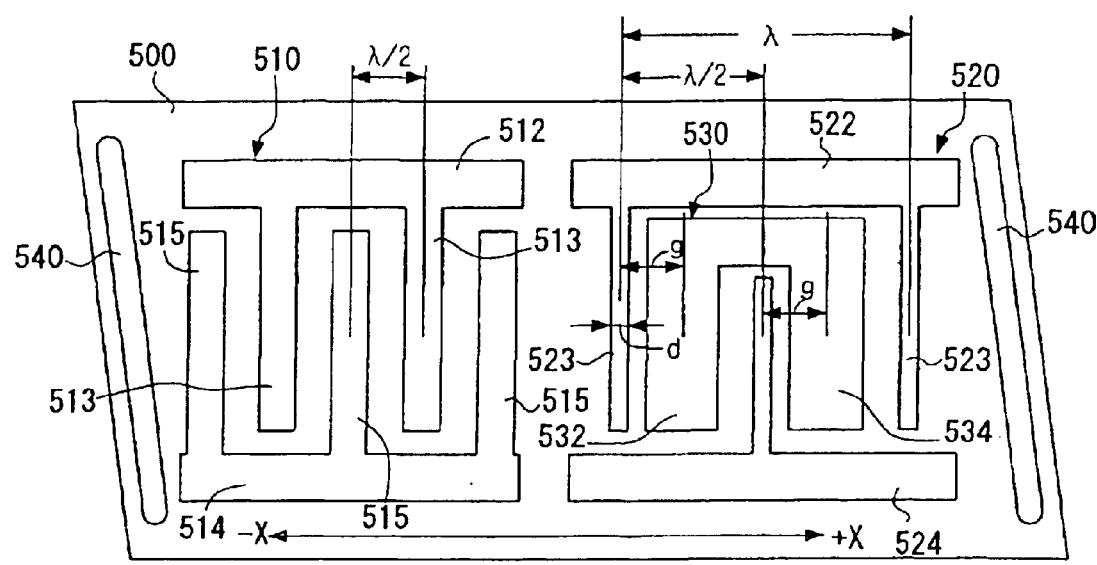
FIG. 18 is a schematic showing the structure of the transmitting type surface acoustic wave filter which is applied with this invention.

Next, the result of the evaluated characteristics is shown, wherein two kinds of the transmitting type surface acoustic wave filter, which was, constituted by using the electrode structure of the surface acoustic wave transducer used for the surface acoustic wave device of the example of this invention, were made to test. The cut surface and the propagation direction of the used langasite substrate, are shown in (0°,140°,24°) by Euler-angles viewing. Moreover, A1 was used as the electrode material. The structure of the 1st transmitting type surface acoustic wave filter (where it is described as filter #1.) as the sample, is shown in FIG. 18. In this figure, on the langasite substrate 500, regular type IDT510 as the transmitting electrode and IDT520 as the receiving electrode, are formed along the propagation direction (+X direction) of the surface acoustic wave. The regular type IDT510 consists of the positive electrode 512 and the negative electrode 514, and are formed so that the multiple positive-electrode fingers 513 and the negative-electrode fingers 515, in which electrode width and the distance between each electrode is λ/4, may be arranged continuously and periodically, and has realized the unidirectional property using NSPUDT characteristics.

Moreover, IDT520 as the receiving electrode, uses the electrode structure of this invention, and consists of the positive electrode 522, the negative electrode 524, and the floating electrode 530. Here, the electrode widths of the positive electrode finger 523 and the negative-electrode finger 525, are λ/16, the distance between both electrode fingers 523 and 525 is λ/2, the distance g between the each center of the positive electrode finger 523 and the electrode finger 532 which constitutes the adjoining floating electrode 530, is 7λ/32, and the width W of the electrode finger of the floating electrode 530, is λ/4. The structure of this receiving electrode is the same as the structure shown in FIG. 4.

The 2nd transmitting type surface acoustic wave filter (where it is described as filter #2) as the sample, uses the same regular type IDT as the above-mentioned 1st transmitting type surface acoustic wave filter, for the transmitting electrode, and uses the IDT of the EWD-RDT structure shown in FIG. 13, for the receiving electrode. Both filters are arranged so that the unidirectional property of the transmitting and receiving electrodes may be countered, as shown in FIG. 18. Moreover, the damper agent 540 for absorbing the reflex of the surface acoustic wave at the edge, is applied to the ends of the langasite substrate 500. The periodic length $\lambda$ of the electrode finger of the filter # 1 and # 2, is 32.15 μm, the thickness of electrode A1 is 300 nm (3000 A). The thinning weighting is given to the transmitting and receiving electrodes.

Figure 19:
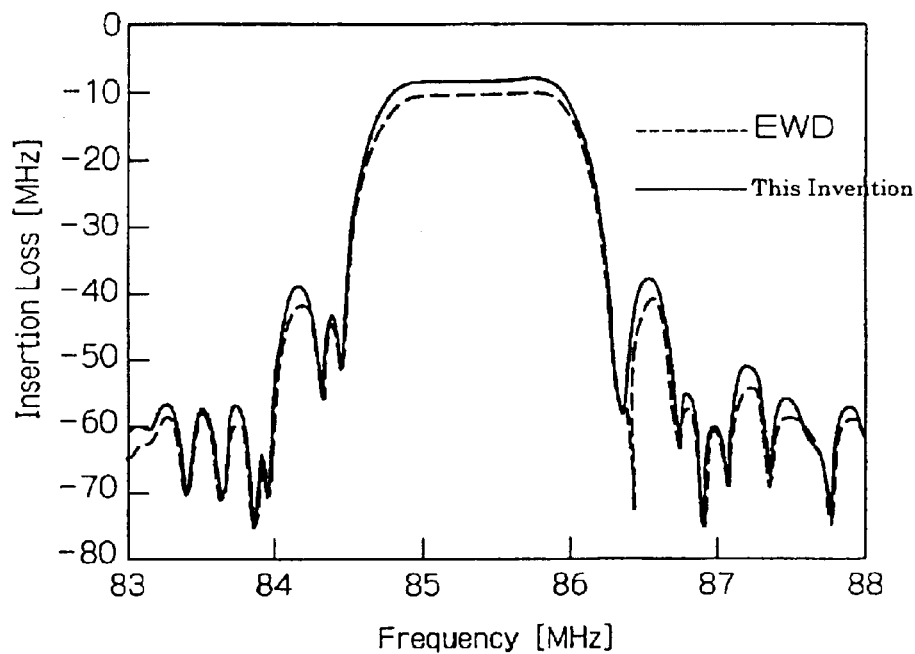
FIG. 19 is the characteristic figure showing the frequency characteristic of the transmitting type surface acoustic wave filter which is applied with this invention, and the transmitting type surface acoustic wave filter which is used IDT of the EWD-RDT structure as the receiving electrode.
Figure 20:
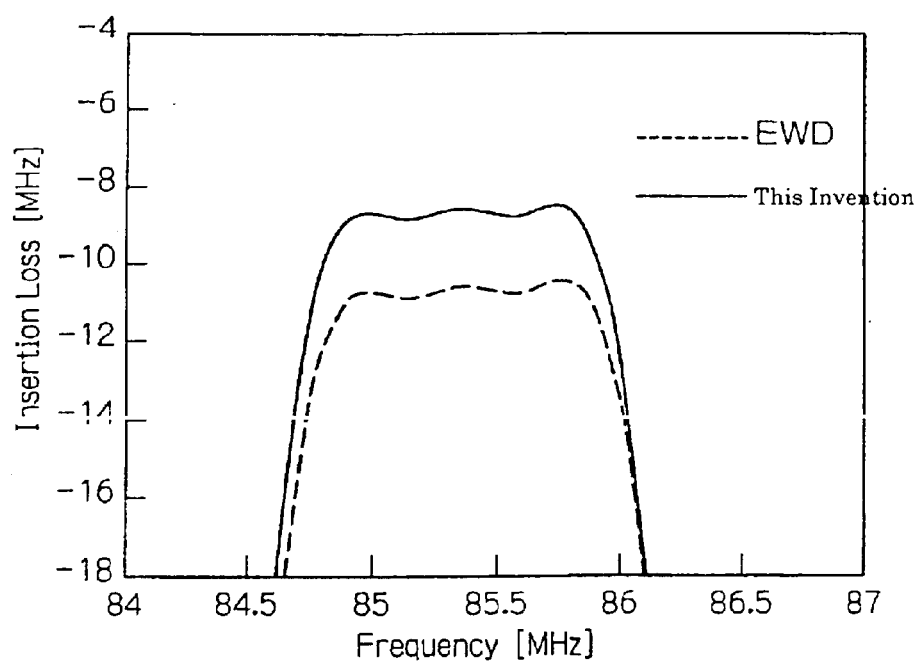
FIG. 20 is the characteristic figure which is expanded near the transit region of the filter in the frequency characteristic shown in FIG. 19.

The measurement results of the frequency characteristics of filter # 1 and filter # 2, are shown in FIG. 19 and 20. FIG. 20 is the magnified figure near the passing band of the filter in the frequency characteristics shown in FIG. 19. FIG. 19 and 20 show that the passing band insertion loss and the ripple in the band, of this invention, are improved. Specifically, as shown in Table 2, as for the passing band insertion loss , the filter # 2 is −10.68 dB to the filter # 1 being −8.84 dB, and as for the ripple in the band, the filter # 2 is 0.46 dB to the filter poi being 0.33 dB.

THE 3rd EXAMPLE

Hereafter, the 3rd example of this invention, is explained in detail by referring the drawing. First, the principle is explained by referring FIG. 1, wherein the natural unidirectional property is occurred, when the so-called regular type electrode (regular type IDT) is formed on the langasite piezoelectricity substrate, on which the multiple positive/negative electrode fingers which have $\lambda/4$ of the electrode width and the distance between each electrode, are arranged continuously and periodically, and is driven excitation. The schematic figure of the regular type electrode is shown in FIG. 1. In this figure, this regular type electrode consists of the positive electrode 1 and the negative electrode 2, and the electric field is occurred between the positive electrode finger 1A which constitutes the positive electrode 1, and the negative electrode finger 2A and 2B which constitutes the negative electrode 2, and are arranged on both side of this positive electrode finger 1A. At this time, the excitation center of the surface acoustic wave, which is generated on the langasite piezoelectricity substrate, by being excited with this electric field, is the almost center A of positive electrode finger 1A.

Moreover, in this electrode structure, the periodically arranged electrode finger having the electrode width $\lambda/4$, is the source of the reflex of the surface acoustic wave. Since the reflex is originated in the discontinuity of the acoustic impedance, the surface acoustic wave is reflected at the edge of each electrode finger. Although the surface acoustic wave reflects at two places of both ends of the electrode finger in this way, it can be thought that the said surface acoustic wave reflects in equivalently at the center of the electrode finger. The phase of the reflected wave is changed at this time. This variation is depended on the kind of piezoelectric substrate and its cut plane, the propagation direction of the surface acoustic wave, and the electrode material and its thickness. For example, when the ST cut X propagation quart crystal is used as the piezoelectric substrate, and A1 is used as the metal material, the phase of the reflective wave is late with 90°, that is, the variation of phase is 90°.

On the other hand, when the langasite single crystal, is used as the substrate, in which langasite is in the range of −5°≦φ≦5°, 135°≦θ≦145° and 20°≦ψ30°, or is the equivalent orientation to this in crystallography, when the substrate orientation and the surface acoustic wave propagation direction are shown by the Euler-angles viewing (φ,θ,ψ), as the piezoelectric crystal, and the regular type IDT is formed by using A1 as the electrode material on said langasite substrate, the variation of phase of the surface acoustic wave, which is reflected by the electrode finger, is 90+2α. When this 2α is considered to be the phase shift at the time of the reflex, the reflective center is defined, as the reflective center is shifted from the center of the electrode finger only with the equivalent amount to this 2α.

Then, the shift δ of the reflective center is shown as the formula (1)

$$\delta = (\alpha/2\pi)\lambda \tag{1}$$

When δ is positive, the reflective center is shifted from the center of the electrode finger to the right side, and when δ is negative, the reflective center is shifted to the left side.

When the shift between the reflective center and the center of the electrode finger, is $\lambda/8$, the phase at point A, of the wave, which is excited at the positive electrode finger 1A, and the wave, which is reflected in each reflective center B and C of the negative electrode finger 2A and 2B, is considered using the FIG. 1. First, the phase at A point of the wave, which is reflected in the path of A→B→A, is shown as the formula (2)

$$-2 \times 3\lambda/8 \times 2\pi/\lambda - \pi/2 = -2\pi \tag{2}$$

This reflective wave is the same phase as the excitation wave. On the other hand, the phase at A point of the wave, which is reflected in the path of A→C→A, is shown as the formula (3)

$$-2 \times \lambda/8 \times 2\pi/\lambda - \pi/2 = -\pi \tag{3}$$

This reflective wave is the phase contrary to the excitation wave. From this reason, since the surface acoustic wave will be excited strongly rightward of FIG. 1, the unidirectional property is realized.

From the above thing, as shown in FIG. 2, when the distance of the excited center and the reflective center, is fulfilled the relation of the formula (4), it becomes possible that the unidirectional property is realized for direction of the excitation center to the reflective center.

$$\lambda/8 + n\lambda/2 (n=0,1,2,\ldots) \tag{4}$$

That is, when the periodic electrode structure (IDT), in which the surface acoustic wave can be excited, is formed in the arbitrary crystal, if the location of the excited center and the reflective center can be specified, it can be decided whether the surface acoustic wave transducer has the unidirectional property, or not. The location of this excited center and the reflective center, are described by the mode coupling parameter, at the time when the mode coupling theory is used.

The mode coupling parameter consists of the self bonding coefficient $\kappa_{11}$, the mode coupling coefficient $\kappa_{12}$, the excitation coefficient $\zeta$, and the electrostatic capacitance C. Here, the mode coupling coefficient $\kappa_{12}$, is expressed with the formula (5).

$$\kappa_{12} = |\kappa h d\ 12|e^{j2\alpha} \tag{5}$$

The phase of the mode coupling coefficient $\kappa_{12}$ is equivalent to the shift of the reflective center from the base plane, and the amount of this shift is expressed with formula (1). Moreover, the excitation coefficient ζ is shown with the formula (6).

$$\zeta = |\zeta| e^{j\beta} \quad (6)$$

The excitation center may be situated at the place where is only separated with the amount of the formula (7) from the base plane.

$$\gamma = (\beta/2\pi)\lambda \quad (7)$$

Therefore, in order for the difference between the reflective center and the excitation center to fulfill the formula (4), there may be required the relationship of the formula (8) between the phases of the mode coupling coefficient $\kappa_{12}$ and excited coefficient ζ.

$$\alpha - \beta = \pi/4 + n\pi (n=0,1,2\ldots) \quad (8)$$

Here, the result analyzed from the mode coupling theory, is shown, wherein the location of the excitation center and the reflective center; about the unidirectional property inversion electrode structure (it is called the TCS-RDT: Tranduction Center Shift type Reversal of Directivity Transducer structure), which is proposed by Mr. Takeuchi in the Tokukai-Hei 8-125484, and about the electrode structure of the surface acoustic wave device of the example of this invention, is analyzed. The cut surface and the propagation direction of the langasite substrate, is shown (0°,140°,24°) by the Euler-angles viewing. Moreover, A1 is used as the electrode material. The TCS-RDT structure is shown in FIG. 3, and the electrode structure of the surface acoustic wave device of the example of this invention, is shown in FIG. 22.

In the FIG. 3, the electrode of the TCS-RDT structure consists of the positive electrode 10 and the negative electrode 20, and when wavelength of the surface acoustic wave, is λ, the electrode widths of both the positive electrode fingers 12 and 14 and the negative electrode fingers 22 and 24, are λ/8, in which the positive electrode fingers 12 and 14, constitutes the positive electrode 10, and the negative-electrode fingers 22 and 24, constitutes the negative electrode 20. In addition, the distance between each center of the positive electrode finger 12 and the negative electrode finger 24 is 6λ/8. Moreover, the electrode width of the floating electrode 30, which is prepared between the positive electrode finger 12 and the negative electrode finger 24, is 3λ/8, and the distance g between each center of the positive-electrode finger 12 and the floating electrode 30, is 3λ/8.

Figure 22:
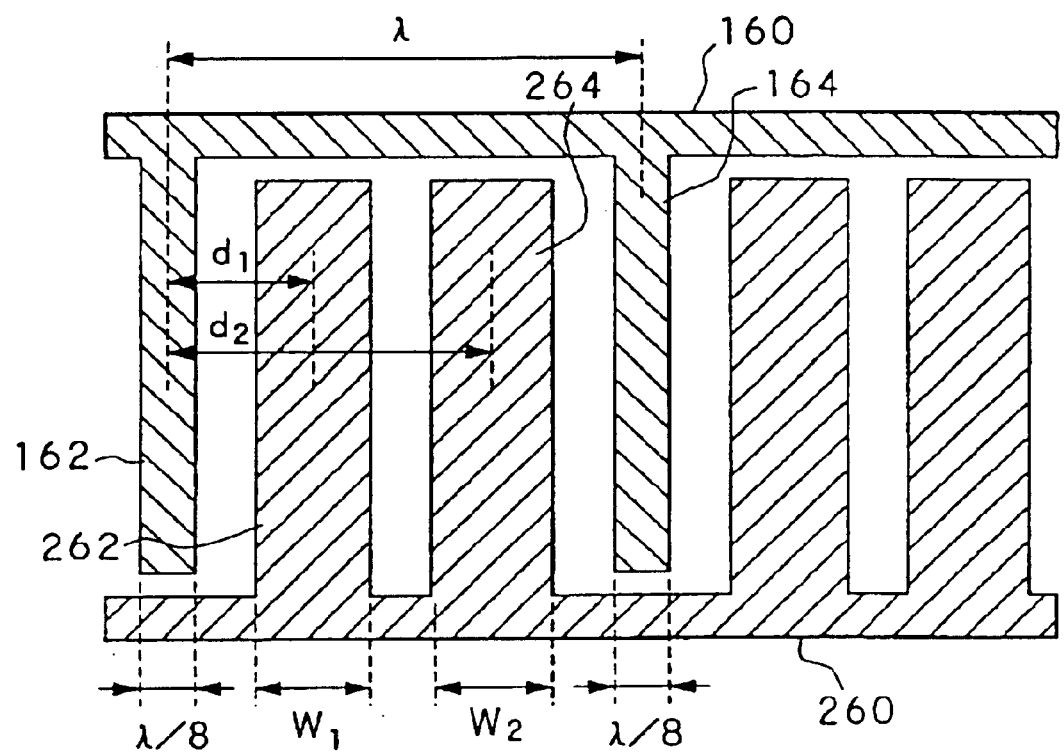
FIG. 22 is a schematic showing the electrode structure of IDT which is used in the surface acoustic wave device of the example of this invention.

On the other hand, the electrode of the surface acoustic wave transducer, which is used for the surface acoustic wave device of the example of this invention, consists of the positive electrode 160 and the negative electrode 260, as shown in FIG. 22, and when wavelength of the surface acoustic wave, is A, the widths of the positive electrode finger 162 and 164, which constitute the positive electrode 160, are about λ/8. In addition, the 1st negative electrode finger 262 and the 2nd negative electrode finger 264, are prepared in one side (in FIG. 22, right-hand side) of one positive electrode finger 162. Here, the distance d1, from the center of the positive electrode finger 162 to the center of the negative electrode finger 262, in which the electrode width W1 is in the range of $18/80\lambda \leq W1 \leq 20/80\lambda$, is $23/80\lambda \leq d1 \leq 25/80\lambda$. Moreover, the distance d2 from the center of the positive electrode finger 162 to the center of the negative electrode finger 264, in which the electrode width W2 is in the range of $20/80\lambda \leq W2 \leq 26/80\lambda$, is $54/80\lambda \leq d2 \leq 55/80\lambda$.

Figure 23:
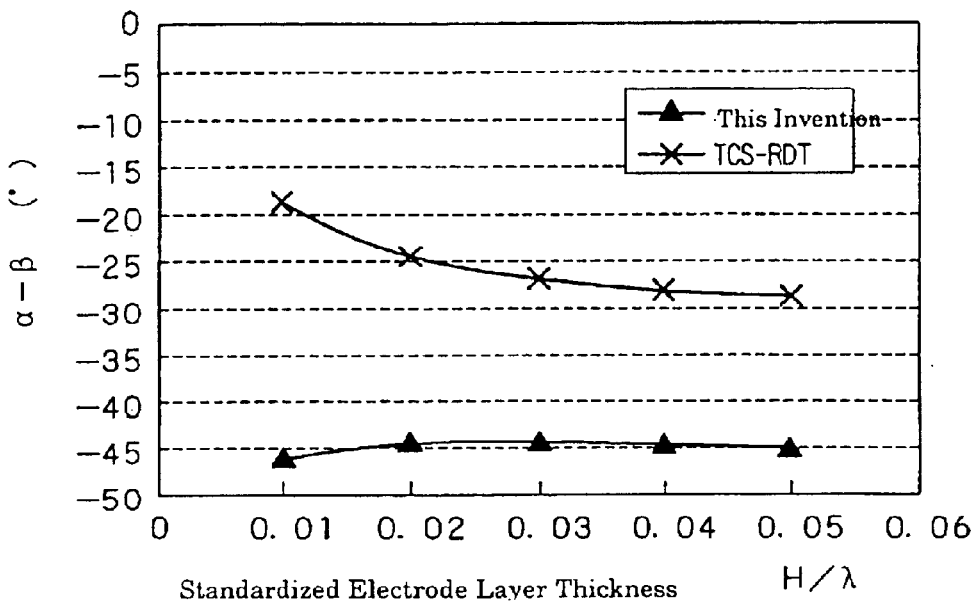
FIG. 23 is the characteristic figure showing the electrode layer thickness dependency of the phase difference ($\alpha-\beta$) of the excitation coefficient $\xi$ and the mode coupling coefficient $\kappa_{12}$.

The dependency of the electrode layer thickness of the phase difference (α–β) of the excitation coefficient ζ and the mode coupling coefficient $\kappa_{12}$, in the electrode structure of the surface acoustic wave transducer, which is used in the surface acoustic wave device of the TCS-RDT structure and the example of this invention, is shown in FIG. 23. In the electrode structure parameter of this receiving side electrode, the width of the 1st positive electrode finger of is about λ/8, and the distance d1 between each center of the 1st negative electrode finger, in which the electrode width W1 is 20/80λ, and the 1st positive electrode finger, is 23/80λ. Furthermore, the distance d2 between each center of the 2nd negative electrode finger, in which the electrode width W2 is 26/80λ, and the 1st positive electrode finger, is 54/80λ.

From this result, in the TCS-RDT structure, the standardization electrode layer thickness H/λ (H is the electrode thickness), is changed between 0 and 0.05, and the magnitude of (α–β), is changed between –30° and near 0°, so it does not reach to –45°, which optimizes the unidirectional property, clearly from the formula (8). On the other hand, by using the electrode structure of the example of this invention, when the standardization thickness is between about 0.01 and 0.05, it can be understood that the value of the phase difference (α–β) becomes –45°, which optimizes the unidirectional property.

Figure 24:
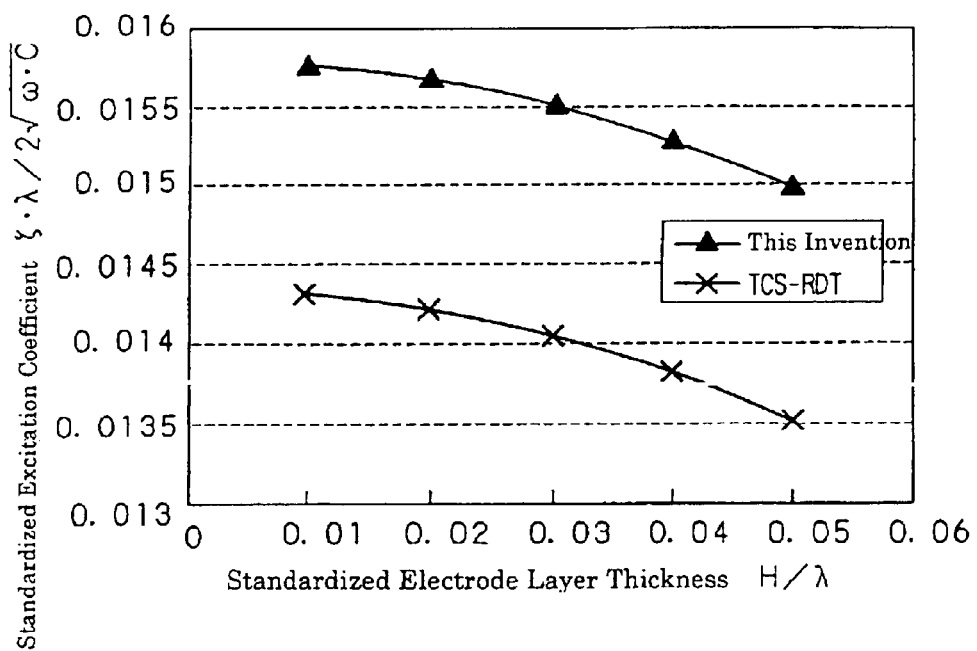
FIG. 24 is the characteristic figure showing the electrode layer thickness dependency of the standardized excitation coefficient.

Moreover, the dependency of the electrode layer thickness of standardization excitation coefficient $\zeta \cdot \lambda/2\sqrt{(\psi \cdot C)}$, in the surface acoustic wave device electrode structure of the example of this invention, and the TCS-RDT structure, is shown in FIG. 24. In the electrode structure of the surface acoustic wave device of the example of this invention, the magnitude of the standardization excitation coefficient increases about 10%, as compared with the TCS-RTD structure. Since the excitation coefficient is equivalently to the conversion efficiency of the electric/sound conversion, if a big value of the excitation coefficient is obtained, it is enable to produce the low loss device.

Figure 25:
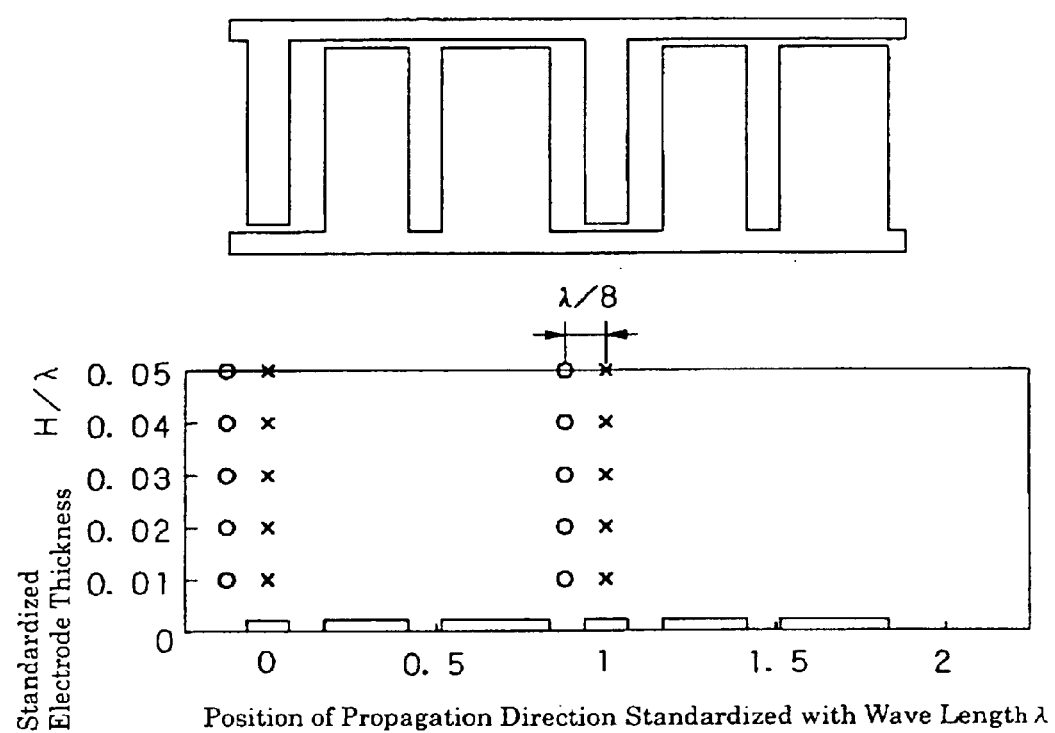
FIG. 25 is the characteristic figure showing the electrode layer thickness dependency of the positions of the excitation center and the reflective center in IDT, which is used in the surface acoustic wave device in the example of this invention.

The dependency of the electrode layer thickness about the location of the excitation center and the reflective center, to the electrode structure of the surface acoustic wave device of the example of this invention, is shown in FIG. 25. In FIG. 25, the schematic of the electrode structure of the surface acoustic wave device shown in FIG. 22, is shown in the upper part, and, in the lower graph, the sectional drawing of the electrode structure of the above mentioned surface acoustic wave device, is shown corresponding to the floor plan, in order to clarify the location relationship of the propagation direction of the surface acoustic wave. Moreover, in these figures, O shows the reflective center and X shows the excited center.

As shown in this figure, in the electrode structure of the surface acoustic wave device of the example of this invention, it is understood that the reflective center is existed on the left side to the excitation center and, since the difference of both distances is about λ/8, the direction of the unidirectional property is the left side of this figure, and the unidirectional property is reversed to the direction of the natural unidirectional property.

Figure 26:
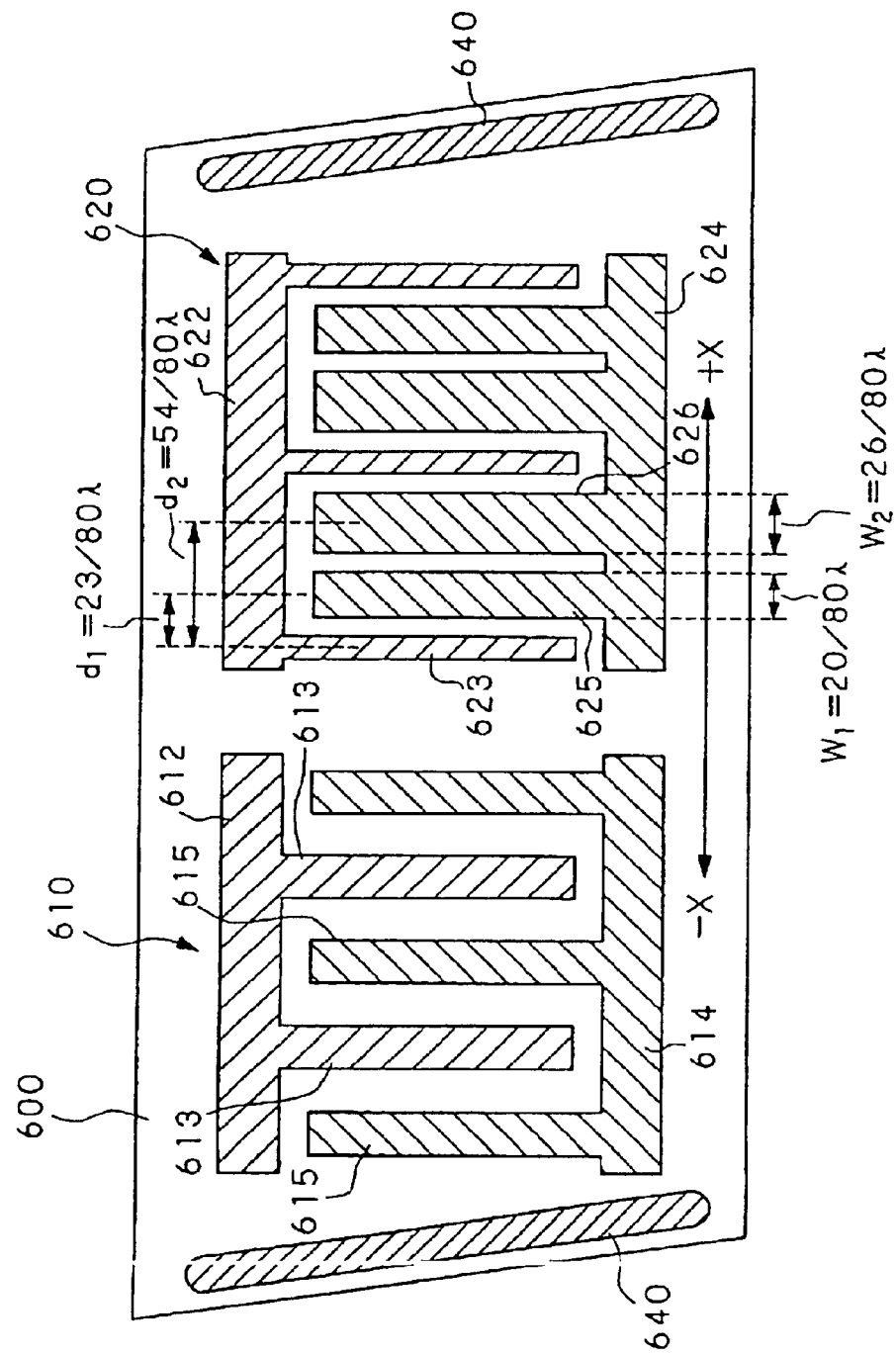
FIG. 26 is a schematic showing the structure of the transmitting type surface acoustic wave filter, which is applied with this invention.

Next, two kinds of the transmitting type surface-acoustic wave filter, which are constituted by using the electrode structure of the surface acoustic wave transducer used for the surface acoustic wave device of the example of this invention, are made to test, and the result of the evaluated characteristics is shown. The cut surface and the propagation direction of the used langasite substrate, is (0°,140°,25°) by Euler-angles viewing. Moreover, A1 was used as the electrode material. The structure of the 1st transmitting type surface acoustic wave filter (where it is described as filter # 1.) as the sample, is shown in FIG. 26. In this figure, on the langasite substrate 600, the regular type IDT610 as the transmitting electrode, and IDT620 as the receiving electrode, are formed along the propagation direction (the direction of +X) of the surface acoustic wave. The regular type IDT610 consists of the positive electrode 612 and the negative electrode 614, and is formed so that the multiple positive electrode fingers 613 and the negative electrode fingers 615, with which both electrode width and electrode spacing is λ/4, may be arranged continuously and periodically, and has realized the unidirectional property by using NPUDT characteristics.

Moreover, IDT620 as the receiving electrode, uses the electrode structure of the surface acoustic wave device of the example of this invention, and consists of the positive electrode 622 and the negative electrode 624. In the electrode structure parameters of this receiving side electrode, the width of the positive electrode finger 623 is about λ/8, and the distance d1 from the center of this positive electrode finger 623 to the center of the 1st negative electrode finger 625, in which the electrode width W1 is 20/80λ, is 23/80λ. Furthermore, the distance d2 from the center of the 2nd negative electrode finger 624, in which the electrode width W2 is 26/80λ, to the center of the 1st positive-electrode finger 623, is 54/80λ.

On the other hand, the 2nd transmitting type surface acoustic wave filter (where it is described as filter #2.) as the sample, used the same regular type IDT as the transmitting type surface acoustic wave filter of the above-mentioned 1st transmitting type surface acoustic wave filter, for the transmitting electrode, and used IDT of the TCS-RDT structure shown in FIG. 3, for the receiving electrode. Both filters are arranged so that the unidirectional property of the transmitting and receiving electrodes may counter, as shown in FIG. 26.

Moreover, the damper agent 640 for absorbing the reflex of the surface acoustic wave at both edges is applied on both ends of the langasite substrate 600. The periodic length A of the electrode finger of the filter #1 and #2, is 32.15 µm, and the thickness of Al electrode of the filter #1 and #2, is 500 nm (5000 A). The thinning weighting is given to the transmitting and receiving electrodes.

Figure 27:
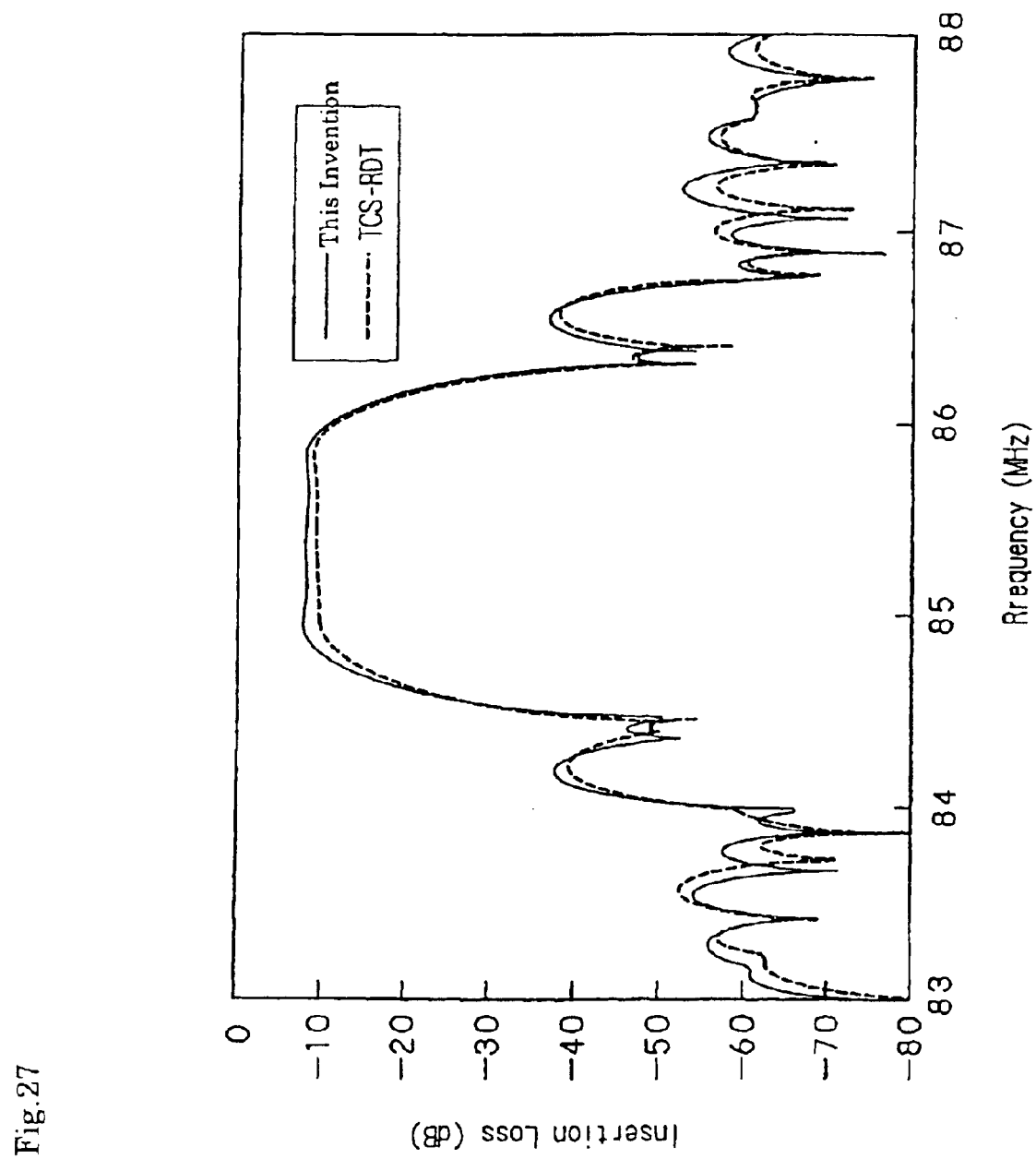
FIG. 27 is the characteristic figure showing the frequency characteristic of the transmitting type surface acoustic wave filter which applied with this invention, and the transmitted type surface acoustic wave filter which is used IDT of the TCS-RDT structure as the receiving electrode.

The measurement result of the frequency characteristics of the filter #1 and the filter #2, is shown in FIG. 27. FIG. 27 shows that the passing band minimum insertion loss, the ripple in the band, and the retardation ripple in the band, of this invention filter, are improved. As specifically shown in Table 3, as for the passing band minimum insertion loss, the filter #2 is −9.0 dB to the filter #1 being −7.8 dB, and as for the ripple in the band, the filter #2 is 0.58 dB to the filter #1 being 0.21 dB. Moreover, as for the retardation ripple in the band, the filter #2 is 80.0 nsec to the filter #1 being 67.3 nsec.

Availability on Industry

According to this invention, the surface acoustic wave device has the surface acoustic wave transducer, which consists of the positive electrode finger, the negative electrode finger, and the floating electrode arranged between these fingers, which are formed on the langasite single crystal substrate surface, in which the substrate orientation and the surface acoustic wave propagation direction were chosen, so that it might have the natural unidirectional property. Since the above-mentioned surface acoustic wave transducer is formed with each above-mentioned electrodes along the propagation direction of the surface acoustic wave, so that the natural unidirectional property might be reversed, the parameter for specifying the electrode structure, it can be possible to make the transmitting type surface acoustic wave filter having low loss by choosing suitable parameters for specifying the electrode structure. That is to say, the width of the above-mentioned positive electrode finger and the negative electrode finger, the distance between each center of the above-mentioned positive electrode finger and the negative electrode finger, the distance between each center of the above-mentioned positive electrode finger and the floating electrode, and the width of the above-mentioned floating electrode, are chosen suitably.

According to this invention, the surface acoustic wave device has the surface acoustic wave transducer, which consists of the positive electrode finger, the negative electrode finger, and the floating electrode arranged between these fingers, which are formed on the surface of the langasite single crystal substrate, in which the substrate orientation and the surface acoustic wave propagation direction were chosen, so that it might have the natural unidirectional property, wherein this floating electrode was formed so that the electrode finger of the adjoining couple might short-circuit ranging over the above-mentioned negative electrode finger. Moreover, since the above-mentioned surface acoustic wave transducer is formed with each above-mentioned electrode along the propagation direction of the surface acoustic wave so that the natural unidirectional property might be reversed, it can be possible to make the transmitting type surface acoustic wave filter by choosing the suitable parameters for specifying the electrode structure. That is to say, the width of the above-mentioned positive electrode finger and the negative electrode finger, the distance between each center of the above-mentioned positive electrode finger and the negative electrode finger, the distance between each center of the above-mentioned positive electrode finger and the floating electrode, and the width of the above-mentioned float electrode, are chosen suitably.

In addition, according to this invention, the surface acoustic wave device has the surface acoustic wave transducer, which consists of the positive electrode finger, which is formed on the surface of the langasite single crystal substrate and installed in the cycle of the wavelength λ of the surface acoustic wave, wherein the substrate orientation and the surface-acoustic wave propagation direction were chosen so that it may have the natural unidirectional property, and the 1st negative electrode finger and the 2nd negative electrode finger, which are installed on one side of said positive electrode finger. Since the above mentioned surface acoustic wave transducer is formed with each above-mentioned electrode along the propagation direction of the surface acoustic wave so that the natural unidirectional property might be reversed, it can be possible to make the transmitting type surface acoustic wave filter by choosing the parameters suitably for specifying the electrode structure. That is to say, the widths of the above the 1st and the 2nd positive electrode fingers and the 1st and 2nd negative electrode fingers, the distance between each center of the 1st positive electrode finger and the 1st and 2nd negative electrode finger, is chosen suitably.

TABLE 1

| | Filter #1 This Invention | Filter #2 TSC-RDT |
| --- | --- | --- |
| Pass-Band Minimum Insertion Loss (dB) | −8.0 | −9.0 |

TABLE 1-continued

| | Filter #1<br>This Invention | Filter #2<br>TSC-RDT |
|---|---|---|
| Ripple in Band (dB) | 0.24 | 0.58 |
| Retardation Ripple in Band (nsec) | 69.5 | 80.0 |

TABLE 2

| | Filter #1<br>This Invention | Filter #2<br>EWD-RDT |
|---|---|---|
| Pass-Band Minimum Insertion Loss (dB) | −8.84 | −10.68 |
| Ripple in Band (dB) | 0.33 | 0.46 |

TABLE 3

| | Filter #1<br>This Invention | Filter #2<br>TSC-RDT |
|---|---|---|
| Pass-Band Minimum Insertion Loss (dB) | −7.8 | −9.0 |
| Ripple in Band (dB) | 0.21 | 0.58 |
| Retardation Ripple in Band (nsec) | 67.3 | 80.0 |

What is claimed is:

1. A surface acoustic wave device comprising:

a surface acoustic wave transducer including a positive electrode finger, a negative electrode finger, and a floating electrode arranged between the positive and negative electrode fingers, which are formed on a langasite single crystal substrate, in which a substrate orientation and a surface acoustic wave propagation direction are selected to have a natural unidirectional property, wherein the positive and negative electrode fingers and the floating electrode are formed along the propagation direction of the surface acoustic wave to reverse the national unidirectional property, wherein the langasite single crystal substrate is in a range $-5° \leq \phi \leq 50°$, $13° \leq \theta \leq 14°$, and $20° \leq \psi \leq 30°$, or is the equivalent orientation in crystallography, when the substrate orientation and the surface acoustic wave propagation direction are described in $(\phi, \theta, \psi)$ by Euler-angles viewing and wherein a width of the positive and negative electrode fingers is about $\lambda/8$, a distance between each center of the positive and negative electrode fingers is about $6/8\lambda$, a distance g between each center of the positive electrode finger and the floating electrode is $13/40\lambda \leq g \leq 14/40\lambda$, and a width W of the floating electrode is $11/40\lambda \leq W \leq 13/40\lambda$, when $\lambda$ is a wavelength of the surface acoustic wave.

2. A surface acoustic wave device comprising:

a surface acoustic wave transducer including a positive electrode finger, a negative electrode finger, and a floating electrode arranged the between the positive and negative electrode fingers, which are formed on a langasite single crystal substrate in which a substrate orientation and a surface acoustic wave propagation direction are selected to have a natural unidirectional property, and said floating electrode includes a pair of floating electrode fingers short-circuited over the negative electrode finger, wherein the positive and negative electrode fingers and the floating electrode are formed along the surface acoustic wave propagation direction to reverse the national unidirectional property, wherein the langasite single crystal substrate is in a range of $-5° \leq \phi \leq 5°$, $135° \leq \theta \leq 145°$, and $20° \leq \psi \leq 30°$, or an equivalent orientation of the range, when said substrate orientation and the surface acoustic wave direction are described in $(\phi, \theta, \psi)$ by Euler-angles viewing, and wherein a distance between each center of the positive and negative electrode fingers is about $\lambda/2$, a width d of the positive and negative electrode fingers is about $\lambda/4$, a distance g between each center of the positive electrode finger and a corresponding adjoining floating electrode finger is $48\lambda/240 \leq g \leq 56\lambda/240$, and the floating electrode has an uneven shape in which each electrode finger of the pair of floating electrode fingers closes to an adjoining left side positive electrode finger or negative electrode finger.

3. A surface acoustic wave device comprising:

a surface acoustic wave transducer formed on a langasite single crystal substrate in which a substrate orientation and a surface acoustic wave propagation direction are selected to have a national unidirectional property, and including a positive electrode finger arranged in a cycle of the wavelength $\lambda$ of the surface acoustic wave, and including first and second negative electrode fingers arranged on one side of said positive electrode finger, wherein the positive and negative electrode fingers and the floating electrode are formed along the surface acoustic wave propagation direction to reverse the natural unidirectional property, wherein the langasite single crystal substrate is in a range of $-5° \leq \phi \leq 5°$, $135° \leq \theta \leq 145°$ and $20° \leq \psi \leq 30$, or an equivalent to the range, when the substrate orientation and the surface acoustic wave direction are described in $(\phi, \theta, \psi)$ by Euler-angles viewing, and wherein a width of the positive electrode finger is about $\lambda/8$, a distance d1 from a center of said positive electrode finger to a center of the first negative electrode finger, in which the negative electrode finger width W1 is in a range of $18/80\lambda \leq W1 \leq 20/80\lambda$, is $23/80\lambda \leq d1 \leq 25/80\lambda$, and a distance d2 from the center of said positive electrode finger to a center of the second negative electrode finger, in which the negative electrode finger width W2 is in a range of $20/80\lambda \leq W2 \leq 26/80\lambda$, is $54/80\lambda \leq d2 \leq 55/80\lambda$, when the wavelength of the surface acoustic wave is $\lambda$.

* * * * *

UNITED STATES PATENT AND TRADEMARK OFFICE
CERTIFICATE OF CORRECTION

| | |
|---|---|
| PATENT NO. | : 7,075,390 B1 |
| APPLICATION NO. | : 10/110222 |
| DATED | : July 11, 2006 |
| INVENTOR(S) | : Bungo et al. |

It is certified that error appears in the above-identified patent and that said Letters Patent is hereby corrected as shown below:

On the title page, Item (86), the § 371 Date is incorrect. Item (86) should read:

-- (86) PCT No.:   PCT/JP00/07616

§ 371 (c)(1),
(2), (4) Date:  May 8, 2002 --

Signed and Sealed this

Nineteenth Day of September, 2006

JON W. DUDAS
*Director of the United States Patent and Trademark Office*

UNITED STATES PATENT AND TRADEMARK OFFICE
CERTIFICATE OF CORRECTION

PATENT NO. : 7,075,390 B1
APPLICATION NO. : 10/110222
DATED : July 11, 2006
INVENTOR(S) : Bungo et al.

It is certified that error appears in the above-identified patent and that said Letters Patent is hereby corrected as shown below:

On the title page, Item (86), the § 371 Date is incorrect. Item (86) should read:

-- (86)  PCT No.:     PCT/JP00/07616

§ 371 (c)(1),
(2), (4) Date:  May 8, 2002 --

Signed and Sealed this

Seventeenth Day of October, 2006

JON W. DUDAS
*Director of the United States Patent and Trademark Office*